United States Patent
Lim et al.

(10) Patent No.: US 12,557,505 B2
(45) Date of Patent: Feb. 17, 2026

(54) DISPLAY DEVICE INCLUDING CONTACT HOLE FOR IMPROVED CONNECTION

(71) Applicant: Samsung Display Co., LTD., Yongin-si (KR)

(72) Inventors: Do Gi Lim, Yongin-si (KR); Seok-Min Kang, Yongin-si (KR); Ki Yeup Lee, Yongin-si (KR); An Su Lee, Yongin-si (KR)

(73) Assignee: Samsung Display Co., LTD., Gyeonggi-do (KR)

( * ) Notice: Subject to any disclaimer, the term of this patent is extended or adjusted under 35 U.S.C. 154(b) by 381 days.

(21) Appl. No.: 18/122,842

(22) Filed: Mar. 17, 2023

(65) Prior Publication Data

US 2023/0363225 A1    Nov. 9, 2023

(30) Foreign Application Priority Data

May 4, 2022  (KR) .......................... 10-2022-0055679

(51) Int. Cl.
*H10K 59/131* (2023.01)
(52) U.S. Cl.
CPC ................................ *H10K 59/1315* (2023.02)
(58) Field of Classification Search
CPC ................................................. H10K 59/1315
USPC ......................................................... 257/40
See application file for complete search history.

(56) References Cited

U.S. PATENT DOCUMENTS

| 2019/0086747 A1 | 3/2019 | Chai et al. |
| 2019/0189717 A1* | 6/2019 | Choi ................. H10K 50/814 |
| 2021/0273145 A1 | 9/2021 | Lee |

FOREIGN PATENT DOCUMENTS

| KR | 10-2016-0007044 | 1/2016 |
| KR | 10-1677770 | 11/2016 |
| KR | 10-1890469 | 8/2018 |
| KR | 20210110464 A | 9/2021 |

\* cited by examiner

*Primary Examiner* — Xia L Cross
(74) *Attorney, Agent, or Firm* — Harness, Dickey & Pierce, P.L.C.

(57) ABSTRACT

A display device according to an embodiment includes: a first wiring layer disposed on a substrate; a first insulating layer disposed on the first wiring layer and including an inorganic material; a second insulating layer disposed on the first insulating layer, and including an organic material; and a second wiring layer disposed on the second insulating layer and electrically connected to the first wiring layer through a contact hole of the first insulating layer and the second insulating layer. A thickness of the second insulating layer is greater than a thickness of the first insulating layer. The contact hole includes a first sub-contact hole formed in the first insulating layer and a second sub-contact hole formed in the second insulating layer. At least part of at least one edge of the first sub-contact hole is covered with the second insulating layer.

18 Claims, 19 Drawing Sheets

DISPLAY DEVICE INCLUDING CONTACT HOLE FOR IMPROVED CONNECTION

CROSS-REFERENCE TO RELATED APPLICATION

This application claims priority to and benefits of Korean Patent Application No. 10-2022-0055679 under 35 U.S.C. § 119, filed in the Korean Intellectual Property Office on May 4, 2022, the entire contents of which are incorporated herein by reference.

BACKGROUND

1. Technical Field

The disclosure relates to a display device without disconnection of an overlying electrode.

2. Description of the Related Art

Display devices include a liquid crystal display (LCD), a plasma display panel (PDP), an organic light emitting diode display device (OLED device), a field emission display (FED), an electrophoretic display, etc.

The emissive display device unlike a liquid crystal display (LCD) does not require a separate light source such as a backlight, so a thickness and a weight of the display device may be reduced. In addition, the emissive display device exhibits high quality characteristics such as low power consumption, high luminance, and high reaction speed.

The emissive display device may include a display area corresponding to a screen displaying an image, and pixels may be disposed in the display area. The pixels may be implemented by light emitting diodes (LEDs). The light emitting diode (LED) may include two electrodes and an emission layer disposed between them. One of the two electrodes may be a pixel electrode provided individually for each pixel, and the other may be a common electrode provided in common to a plurality of pixels.

The pixel electrode may be connected to a signal line through a contact hole formed in a plurality of insulating layers to receive a pixel voltage.

At this time, if the taper angle of the contact hole formed in the insulating layers is large, the pixel electrode disposed in the contact hole may be disconnected.

The above information disclosed in this Background section is only for enhancement of understanding of the background of the described technology, and therefore it may contain information that does not form the prior art that is already known in this country to a person of ordinary skill in the art.

SUMMARY

Embodiments provide a display device capable of preventing a disconnection of an overlying electrode connected to an underlying signal line through a contact hole by smoothing a taper angle of a contact hole formed in a plurality of insulating layers.

However, the embodiments of the disclosure are not limited to those set forth herein. The above and other embodiments will become more apparent to one of ordinary skill in the art to which the disclosure pertains by referencing the detailed description of the disclosure given below.

A display device according to an embodiment includes: a first wiring layer disposed on a substrate; a first insulating layer disposed on the first wiring layer and including an inorganic material; a second insulating layer disposed on the first insulating layer, and including an organic material; and a second wiring layer disposed on the second insulating layer and electrically connected to the first wiring layer through a contact hole of the first insulating layer and the second insulating layer. A thickness of the second insulating layer is greater than a thickness of the first insulating layer. The contact hole includes a first sub-contact hole formed in the first insulating layer and a second sub-contact hole formed in the second insulating layer. At least part of at least one edge of the first sub-contact hole is covered with the second insulating layer.

The at least one edge of first sub-contact hole may include two first edges parallel to each other and two second edges parallel to each other. A length of each of the two first edges may be greater than a length of each of the two second edges.

The length of each of the two first edges may be at least 1.5 times the length of each of the two second edges.

A taper angle between each of the two first edges and a surface of the substrate may be less than a taper angle between each of the two second edges and the surface of the substrate.

One of the two second edges may be covered by the second insulating layer.

The second sub-contact hole may include two third edges parallel to the two first edges and two fourth edges parallel to the two second edges. A length of each of the two fourth edges may be greater than the length of each of the two second edges.

Both of two second edges may be covered by the second insulating layer.

The second sub-contact hole may include two third edges parallel to the two first edges and two fourth edges parallel to the two second edges, and a length of each of the two fourth edges may be longer than the length of each of the two second edges.

A taper angle between each of the two first edges and a surface of the substrate may be less than a taper angle between each of the two second edges and the surface of the substrate.

The second sub-contact hole may include two third edges parallel to the two first edges and two fourth edges parallel to the two second edges. A length of each of the two fourth edges may be greater than the length of each of the two second edges.

The second sub-contact hole may overlap at least part of the first sub-contact hole in a plan view.

The first sub-contact hole may be in a form of a rectangle.

A display device according to an embodiment includes: a first wiring layer disposed on a substrate; a first insulating layer disposed on the first wiring layer and including an inorganic material; a second insulating layer disposed on the first insulating layer, and including an organic material; and a second wiring layer disposed on the second insulating layer and electrically connected to the first wiring layer through a contact hole of the first insulating layer and the second insulating layer. A thickness of the second insulating layer is greater than a thickness of the first insulating layer. The contact hole includes a first sub-contact hole formed in the first insulating layer and a second sub-contact hole formed in the second insulating layer. The first sub-contact hole includes two first edges parallel to each other and two second edges parallel to each other. A length of each of the two first edges is greater than a length of each of the two second edges. A taper angle between each of the two first edges and a surface the substrate is less than a taper angle between each of the two second edges and the surface of the substrate.

The length of each of the two first edges may be at least 1.5 times the length of each of the two second edges.

The second sub-contact hole may include two third edges parallel to the two first edges and two fourth edges parallel to the two second edges. A length of each of the two fourth edges may be greater than the length of each of the two second edges.

At least part of the two fourth edges may be disposed within the first sub-contact hole.

At least part of the two first edges and the two second edges of the first sub-contact hole may be covered by the second insulating layer.

At least part of the two first edges and the two second edges of the first sub-contact hole may be covered by the second insulating layer.

At least part of an edge of the second sub-contact hole may be disposed within the first sub-contact hole.

The second sub-contact hole may overlap at least part of at least one of the two second edges in a plan view.

According to embodiments, the contact hole formed in the insulating layers may have the smooth taper angle, and the disconnection of the upper electrode electrically connected to the lower signal line through the contact hole may be prevented.

However, the effects of the embodiments are not limited to the above-described effects, and the embodiments may be variously expanded within a range that does not deviate from the spirit and scope of the embodiments.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
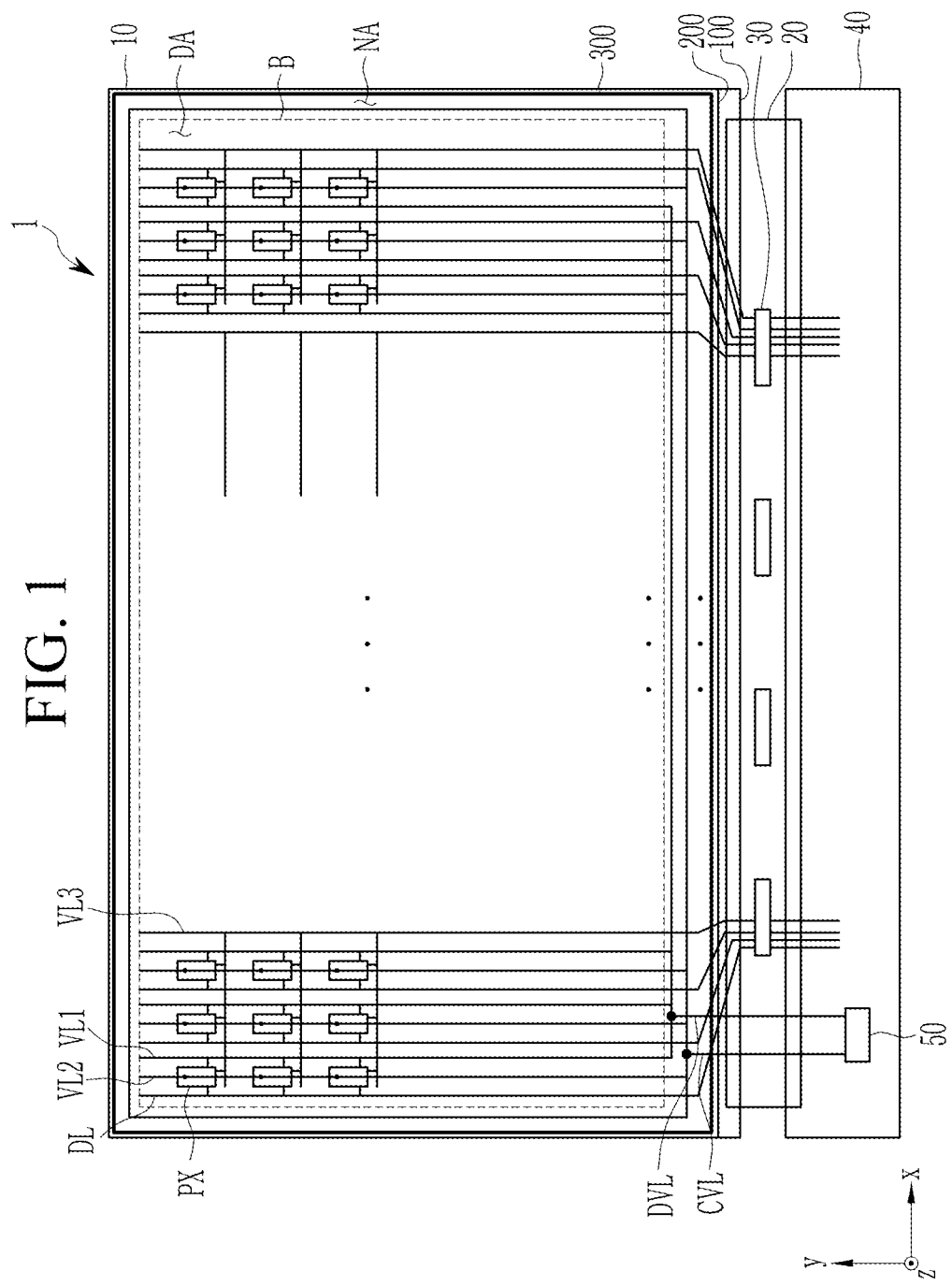
FIG. 1 is a schematic plan view of an emissive display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

Descriptions of parts not related to the embodiments are omitted, and like reference numerals denote like elements throughout the specification.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order.

When an element, such as a layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, in the specification, the word "on" or "above" means positioned on or below the object portion, and does not necessarily mean positioned on the upper side of the object portion based on a gravitational direction.

Although the terms "first," "second," or the like may be used herein to describe various of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Further, in the specification, the phrase "on a plane" or "in a plan view" means when an object portion is viewed from above, and the phrase "on a cross-section" or "in a cross-sectional view" means when a cross-section taken by vertically cutting an object portion is viewed from the side.

In addition, in the specification, when referring to "connected to", this does not only mean that two or more constituent elements are directly connected, but also that two or more constituent elements are electrically connected through other constituent elements as well as being indirectly connected and being physically connected, or it may mean that they are referred to by different names according to a position or function, but are integrated. Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the disclosure. Further, the blocks, units, and/or modules of some embodiments may be physically combined into more complex blocks, units, and/or modules without departing from the scope of the disclosure.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

In the drawings, symbols "x", "y", and "z" representing directions are used, where "x" is a first direction, "y" is a second direction perpendicular to the first direction, and "z" is a third direction perpendicular to the first direction and the second direction. The first direction x, the second direction y, and the third direction z may correspond to a horizontal direction, a vertical direction, and a thickness direction of the display device, respectively.

Hereinafter, various embodiments are described in detail with reference to the drawings.

FIG. 1 is a schematic plan view of an emissive display device according to an embodiment.

Referring to FIG. 1, an emissive display device 1 (hereinafter, referred to as "a display device") may include a display panel 10, a flexible printed circuit film 20, a driving integrated circuit chip 30, a printed circuit board (PCB) 40, a power module 50, and the like.

The display panel 10 may include a display area DA corresponding to a screen displaying an image and a non-display area NA where circuits and/or wires for generating and/or transmitting various signals applied to the display area are disposed. The non-display area NA may be adjacent to the display area DA and may surround the display area DA. In FIG. 1, an inner region and an outer region of a boundary line B may be the display area DA and the non-display area NA, respectively.

The display panel 10 may include a display part 100 and a color conversion part 200. The display part 100 and the color conversion part 200 may be combined by a sealant 300 disposed around an edge of the display panel 10 between the display part 100 and the color conversion part 200. The color conversion part 200 may overlap the display part 100 as a whole (e.g., in a direction or in a view). In other embodiments, the display part 100 may include a region not covered by the color conversion part 200 for connection or bonding of the flexible printed circuit film 20. The display part 100 may include a pad part (not shown) for connecting or bonding of the flexible printed circuit film 20. The conversion part 200 may be shorter than the display part 100 in a region in which the pad part is disposed, and the pad part may be exposed to the outside. For example, a lower part of the display panel 10 may be exposed by the conversion part 200. The display part 100 and the color conversion part 200 may include regions corresponding to the display area DA and the non-display area NA of the display panel 10, respectively.

In the display area DA of the display panel 10, pixels PX may be disposed in a matrix form. Also, in the display area DA, a data line DL for transmitting a data voltage $V_{DATA}$ (e.g., refer to FIG. 2), a driving voltage line VL1 for transmitting a driving voltage $EL_{VDD}$ (e.g., refer to FIG. 2), a common voltage line VL2 for transmitting a common voltage $EL_{VSS}$ (e.g., refer to FIG. 2), and an initialization voltage line VL3 for transmitting an initialization voltage $V_{INT}$ (e.g., refer to FIG. 2) may be disposed. The driving voltage line VL1, the common voltage line VL2, and the initialization voltage line VL3 may extend in a second direction y. The driving voltage line VL1, the common voltage line VL2, and/or the initialization voltage line VL3 may be electrically connected to an auxiliary voltage line extending in the first direction x. Each pixel PX may receive the data voltage $V_{DATA}$, the driving voltage $EL_{VDD}$, the common voltage $EL_{VSS}$, and the initialization voltage $V_{INT}$ from these voltage lines DL, VA1, VL2, and VL3. The driving voltage $EL_{VDD}$ and the common voltage $EL_{VSS}$ may be power supply voltages applied to each pixel PX. The driving voltage line VL1 and the common voltage line VL2 that transmit such a power supply voltage may be referred to as power supply voltage lines. The driving voltage $EL_{VDD}$ may be higher than the common voltage $EL_{VSS}$. The driving voltage $EL_{VDD}$ may be referred to as a first power supply voltage or a high potential power supply voltage. The common voltage $EL_{VSS}$ may be referred to as a second power supply voltage or a low potential power supply voltage.

In the non-display area NA of the display panel 10, a gate driver (not shown) may be disposed on sides (e.g., both sides) of the display area DA. The gate driver may be integrated in the non-display area NA. The pixels PX may receive a gate signal (also referred to as a scan signal) generated by the gate driver and receive the data voltage $V_{DATA}$ at a timing (e.g., a predetermined or selectable timing).

In the non-display area NA of the display panel 10, a driving voltage transmission line DVL electrically connected to driving voltage lines VL1, a common voltage transmission line CVL electrically connected to common voltage lines VL2, etc. may be disposed. The driving voltage transmission line DVL and the common voltage transmission line CVL may include portions extending (e.g., approximately extending) in the second direction y and portions extending (e.g., approximately extending) in the first direction x, respectively. For example, the driving voltage transmission line DVL and the common voltage transmission line CVL may be broken lines. The common voltage transmission line CVL may be adjacent to (e.g., surround) the display area DA. The common voltage lines VL2 may be electrically connected to the common voltage transmission line CVL at a lower side and an upper side of the display area DA. Thus, the common voltage $EL_{VSS}$ may be uniformly supplied over the entire display area DA.

An end of the flexible printed circuit film 20 may be electrically connected (or bonded) to the display part 100 of the display panel 10, and another end thereof may be electrically connected (or bonded) to the printed circuit board (PCB) 40. In the flexible printed circuit film 20, the driving integrated circuit chip 30 including the data driver that applies the data voltage $V_{DATA}$ to the data line DL may be disposed.

The power module 50 that generates a power supply voltage such as the driving voltage $EL_{VSS}$ and the common voltage $EL_{VDD}$ may be disposed on the printed circuit board (PCB) 40. The power module 50 may be provided in the form of an integrated circuit chip. A signal controller (not shown) that controls the data driver and the gate driver may be disposed on the printed circuit board (PCB) 40.

Figure 2:
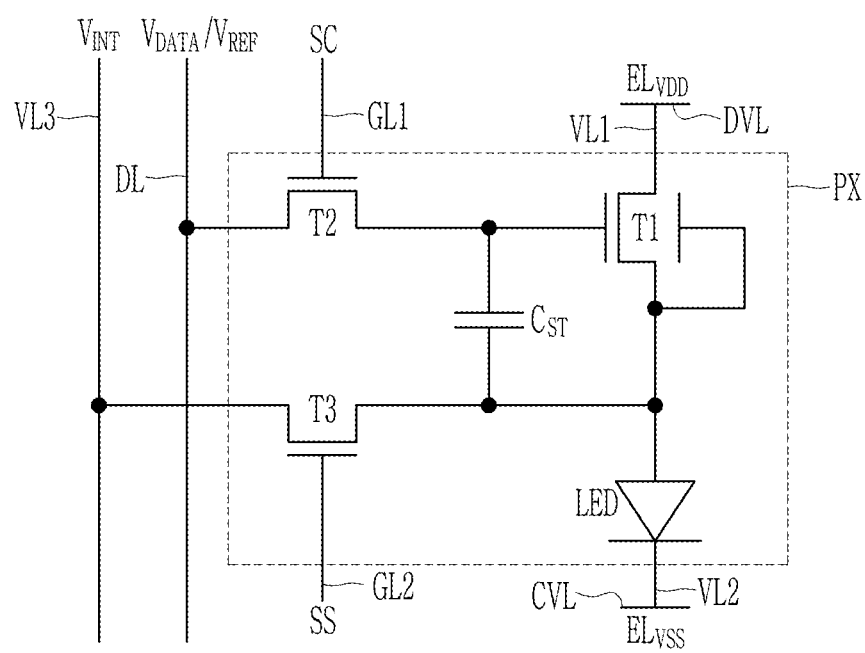
FIG. 2 is a schematic diagram of an equivalent circuit of a pixel of an emissive display device according to an embodiment.

FIG. 2 is a schematic diagram of an equivalent circuit of a pixel of an emissive display device according to an embodiment.

Referring to FIG. 2, a pixel PX may include first to third transistors T1 to T3, a storage capacitor $C_{ST}$, and a light emitting diode (LED) LED. The light emitting diode LED may be an organic or inorganic light emitting diode (LED). The first to third transistors T1 to T3 may be N-type transistors. In other embodiments, at least some of the first to third transistors T1 to T3 may be P-type transistors.

A gate electrode of the first transistor T1 may be electrically connected to a first electrode of the storage capacitor $C_{ST}$. The first electrode of the first transistor T1 may be electrically connected to the driving voltage line VL1 that transmits the driving voltage $EL_{VDD}$. A second electrode of the first transistor T1 may be electrically connected to an anode of the light emitting diode LED and a second electrode of the storage capacitor $C_{ST}$. The first transistor T1 may receive the data voltage $V_{DATA}$ according to a switching operation of the second transistor T2, and may supply a driving current to the light emitting diode LED according to a voltage stored in the storage capacitor $C_{ST}$.

A gate electrode of the second transistor T2 may be electrically connected to the first gate line GL1 transmitting a first scan signal SC. A first electrode of the second transistor T2 may be electrically connected to a data line DL capable of transmitting a data voltage $V_{DATA}$ or a reference voltage $V_{REF}$. A second electrode of the second transistor T2 may be electrically connected to the first electrode of the storage capacitor $C_{ST}$ and the gate electrode of the first transistor T1. The second transistor T2 may be turned on according to the first scan signal SC to transmit the reference voltage $V_{REF}$ or the data voltage $V_{DATA}$ to the gate electrode of the first transistor T1.

A gate electrode of the third transistor T3 may be electrically connected to a second gate line GL2 that transmits a second scan signal SS. A first electrode of the third transistor T3 may be electrically connected to the initialization voltage line VL3 that transmits the initialization voltage $V_{INT}$. A second electrode of the third transistor T3 may be electrically connected to the second electrode of the storage capacitor $C_{ST}$, the second electrode of the first transistor T1, and the anode. The third transistor T3 may be turned on according to the second scan signal SS and transmit the initialization voltage $V_{INT}$ to the anode to initialize a voltage of the anode.

The first electrode of the storage capacitor $C_{ST}$ may be electrically connected to the gate electrode of the first transistor T1. The second electrode of the storage capacitor $C_{ST}$ may be electrically connected to the second electrode of the third transistor T3 and the anode. A cathode of the light emitting diode LED may be electrically connected to the common voltage line VL2 that transmits the common voltage $EL_{VSS}$. Each light emitting diode LED may constitute (or be disposed in) the pixel PX, and the anode and the cathode of the light emitting diode LED may be referred to as a pixel electrode and a common electrode, respectively.

The light emitting diode LED may emit light of a luminance (e.g., a grayscale) according to the driving current generated by the first transistor T1.

An example of an operation of the circuit shown in FIG. 2 (e.g., an operation for a frame) is described with an example in which the transistors T1 to T3 are all N-type transistors.

When a frame starts, in an initialization period, in a state where the first scan signal SC and the second scan signal SS are a low level, a common voltage $EL_{VSS}$ may be applied as a high level voltage (e.g., a voltage of a high level). Accordingly, it is possible to prevent a current from flowing through the light emitting diode LED to prevent the light emitting diode LED from emitting light. Also, the initialization voltage $V_{INT}$ may be applied through the initialization voltage line VL3 to initialize the initialization voltage line VL3. The first scan signal SC of high level and the second scan signal SS of high level may be supplied to turn on the second transistor T2 and the third transistor T3. The reference voltage $V_{REF}$ supplied from the data line DL may be supplied to the gate electrode of the first transistor T1 and the first electrode of the storage capacitor $C_{ST}$ through the turned-on second transistor T2. The initialization voltage $V_{INT}$ may be supplied to the second electrode of the first transistor T1 and the anode through the turned-on third transistor T3. Accordingly, during the initialization period, the anode may be initialized with the initialization voltage $V_{INT}$. The voltage difference ($V_{REF}$–$V_{INT}$) between the reference voltage $V_{REF}$ and the initialization voltage $V_{INT}$ may be stored in the storage capacitor $C_{ST}$.

In a sensing period, the first scan signal SC of high level and the second scan signal SS of high level may be maintained. For example, the initialization voltage line VL3 may be disconnected from a supply source of the initialization voltage $V_{INT}$ and may function as (or be implemented with) a sensing line. Through the second transistor T2, the gate electrode of the first transistor T1 and the first electrode of the storage capacitor $C_{ST}$ may maintain the reference voltage $V_{REF}$. Accordingly, when the current flows from the first electrode to the second electrode of the first transistor T1 and the voltage of the second electrode becomes "the reference voltage $V_{REF}$—a threshold voltage (VTH)", the first transistor T1 may be turned off and the initialization voltage line VL3 may be charged up to "the reference voltage $V_{REF}$—the threshold voltage (VTH)". The threshold voltage (VTH) represents the threshold voltage (VTH) of the first transistor T1. The initialization voltage line VL3 charged with the "the reference voltage $V_{REF}$—the threshold voltage (VTH))" may be electrically connected to an external circuit, and the external circuit may sense the voltage of the initialization voltage line VL3 to extract the threshold voltage (VTH) of the first transistor T1. A compensated data signal may be generated based on the characteristic information sensed during the sensing period, and it is possible to compensate for the characteristic deviation of the first transistor T1, which may be different for each pixel PX.

In a data input period, the first scan signal SC of a high level may be supplied to the first gate line GL1 and the second scan signal SS of a low level may be supplied to the second gate line GL2, and the data voltage $V_{DATA}$ of the data line DL may be supplied to the gate electrode of the first transistor T1 and the first electrode of the storage capacitor $C_{ST}$ through the turned-on second transistor T2. The data voltage $V_{DATA}$ may have a compensated value based on the sensing of the threshold voltage (VTH) of the first transistor T1. Thus, the characteristic deviation of the first transistor T1 may be corrected. In case that the data voltage $V_{DATA}$ is applied to the data line DL, the second electrode of the first transistor T1 and the anode may almost maintain a potential (e.g., a potential difference) in the sensing period by the first transistor T1 (or the turned-off first transistor T1) in a turn-off state.

In a light emission period, the first transistor T1 may be turned-on by the data voltage $V_{DATA}$ transmitted to the gate electrode of the first transistor and generate a driving current depending on the data voltage $V_{DATA}$. Thus, the light emitting diode LED may emit light by the driving current. For example, the driving current applied to the light emitting diode LED may be adjusted according to the size of the data voltage $V_{DATA}$ applied to the pixel PX, and the luminance of the light emitting diode LED may be adjusted.

Figure 3:
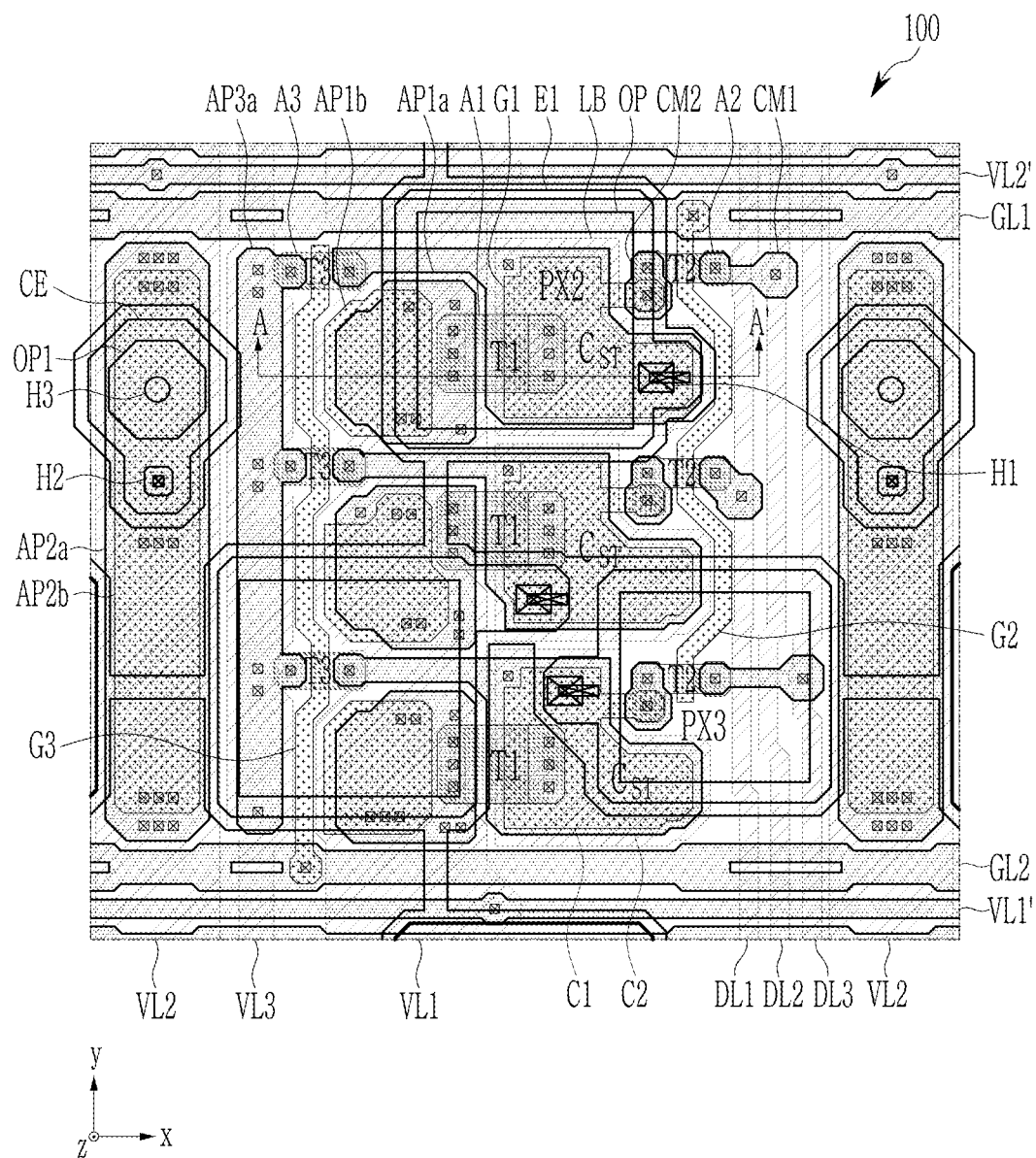
FIG. 3 is a schematic plan view of a pixel area of an emissive display device according to an embodiment.
Figure 4:
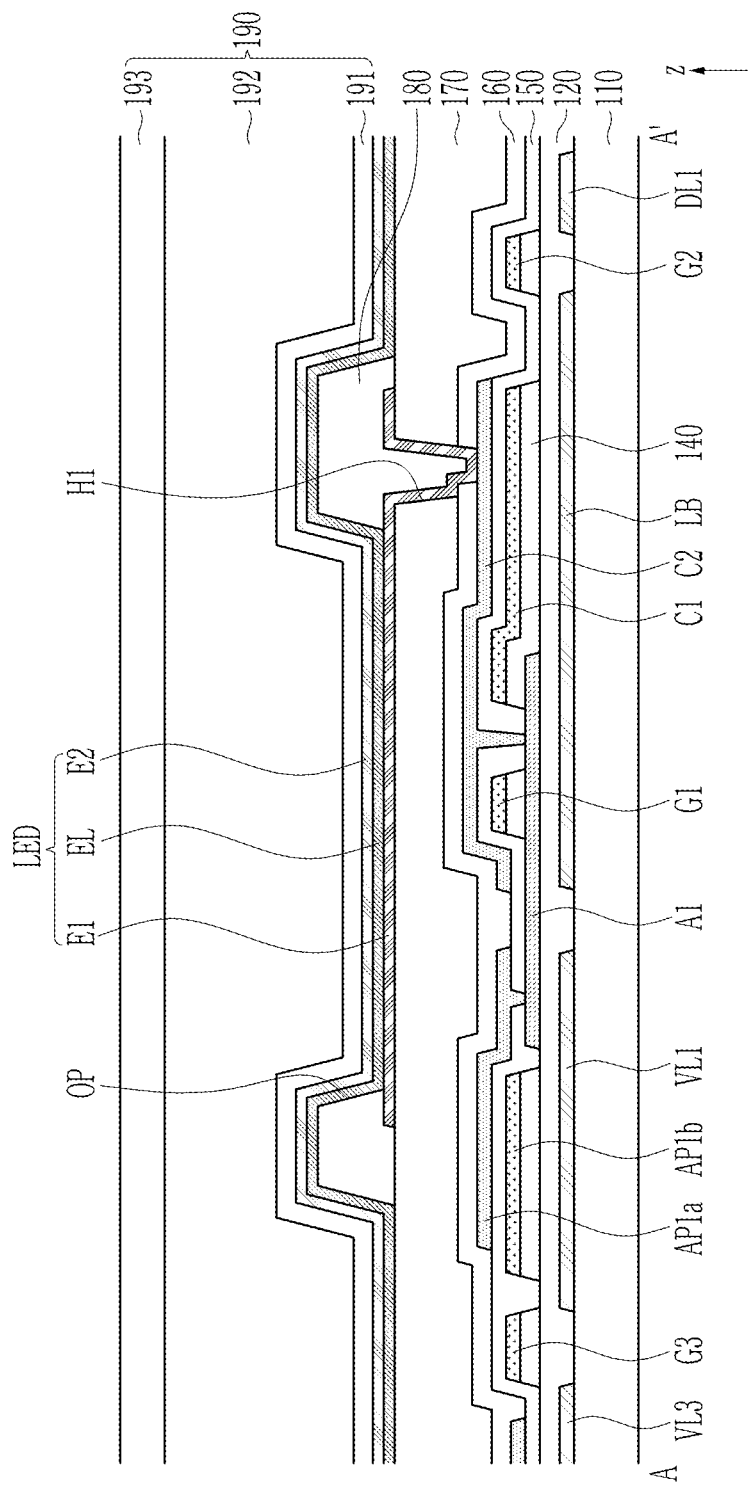
FIG. 4 is a schematic cross-sectional view taken along line A-A' in FIG. 3.
Figure 5:
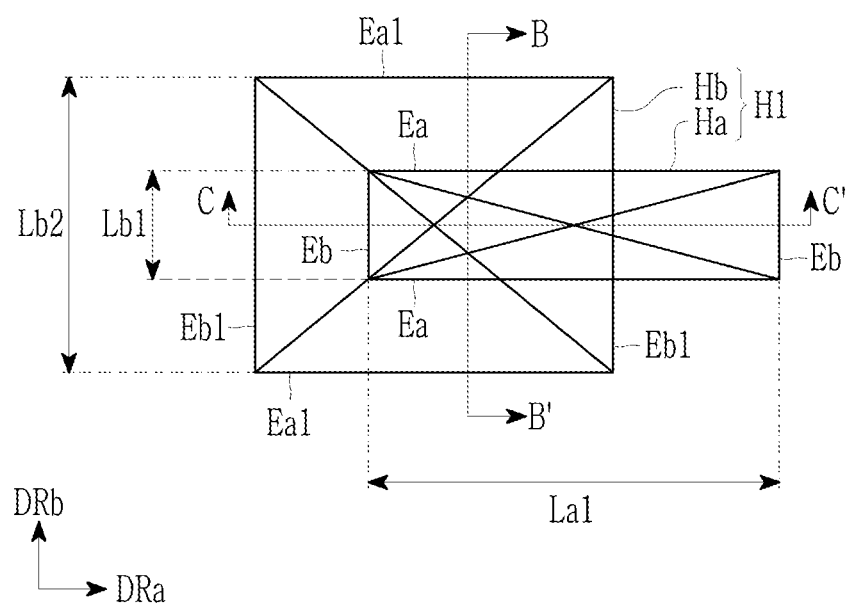
FIG. 5 is a schematic enlarged view showing a part of FIG. 3.
Figure 6:
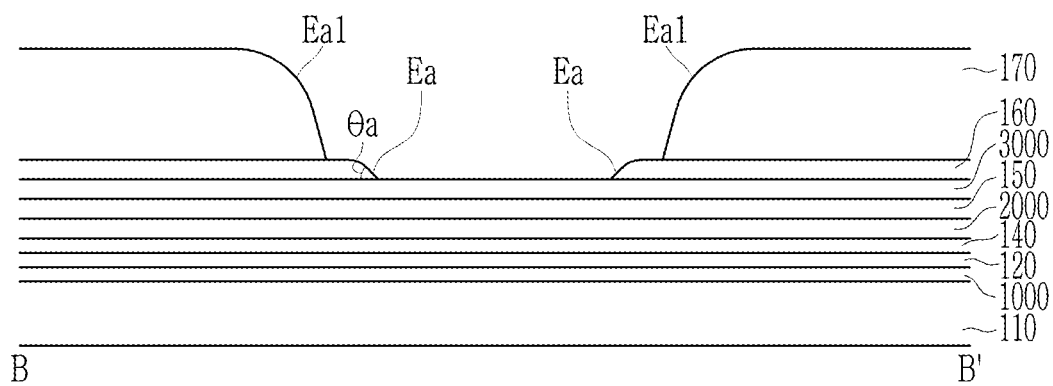
FIG. 6 is a schematic cross-sectional view taken along line B-B' of FIG. 5.
Figure 7:
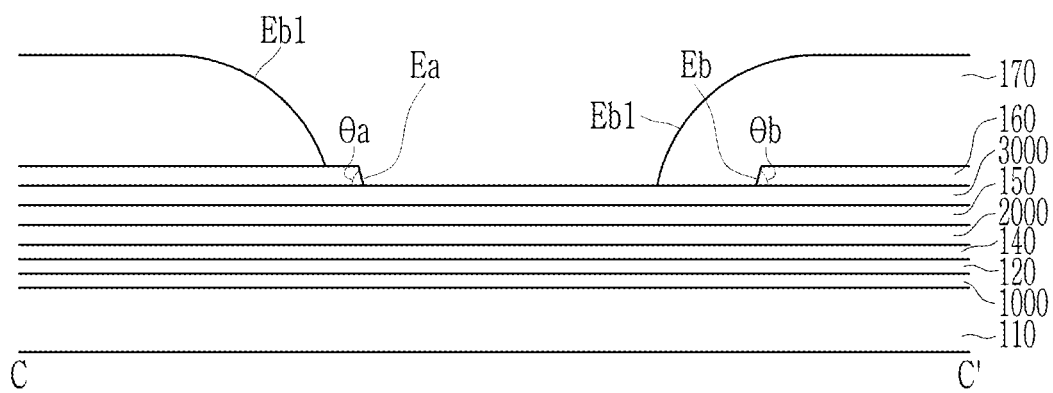
FIG. 7 is a schematic cross-sectional view taken along line C-C' of FIG. 5.

The display device according to an embodiment is described in more detail with reference to FIGS. 3 to 12. FIG. 3 is a schematic plan view of a pixel area of an emissive display device according to an embodiment. FIG. 4 is a schematic cross-sectional view taken along line A-A' in FIG. 3. FIG. 5 is a schematic enlarged view showing a part of FIG. 3. FIG. 6 is a schematic cross-sectional view taken along line B-B' of FIG. 5. FIG. 7 is a schematic cross-sectional view taken along line C-C' of FIG. 5. FIGS. 8 to 12 are schematic plan views showing an emissive display device shown in FIG. 3 according to a manufacturing sequence.

FIG. 3 shows three pixels PX1, PX2, and PX3 adjacent to each other in the display panel 10 included in the display device according to an embodiment, and wirings electrically connected thereto. The pixels PX1, PX2, and PX3 may be repeatedly disposed in a matrix shape. The display part 100 of the display panel 10 is mainly explained, and the color conversion part 200 of the display panel 10 is described later with reference to FIG. 19.

Referring to FIGS. 3 and 4, the display part 100 may include a light emitting diode LED corresponding to each of the pixels PX1, PX2, and PX3. The pixels PX1, PX2, and PX3 may include a first pixel PX1, a second pixel PX2, and a third pixel PX3 emitting different colors. For example, one of the first pixel PX1, the second pixel PX2, and the third pixel PX3 may display red, another of the first pixel PX1, the second pixel PX2 and the third pixel PX3 may display green, and still another of the first pixel PX1, the second pixel PX2 and the third pixel PX3 may display blue.

The display part 100 may include a substrate 110, first to third transistors T1, T2, and T3 (e.g., refer to FIG. 2), and a storage capacitor $C_{ST}$ (e.g., refer to FIG. 2) formed on the substrate 110, and a light emitting diode LED electrically connected to the first transistor T1.

The substrate 110 may include a material having a rigid characteristic, such as glass, or a material having a flexible characteristic, such as plastic. For example, the substrate 110 may be a glass substrate. The substrate 110 may include a polymer material such as a polyimide, a polyamide, or a polyethylene terephthalate. However, the disclosure is not limited thereto.

Figure 8:
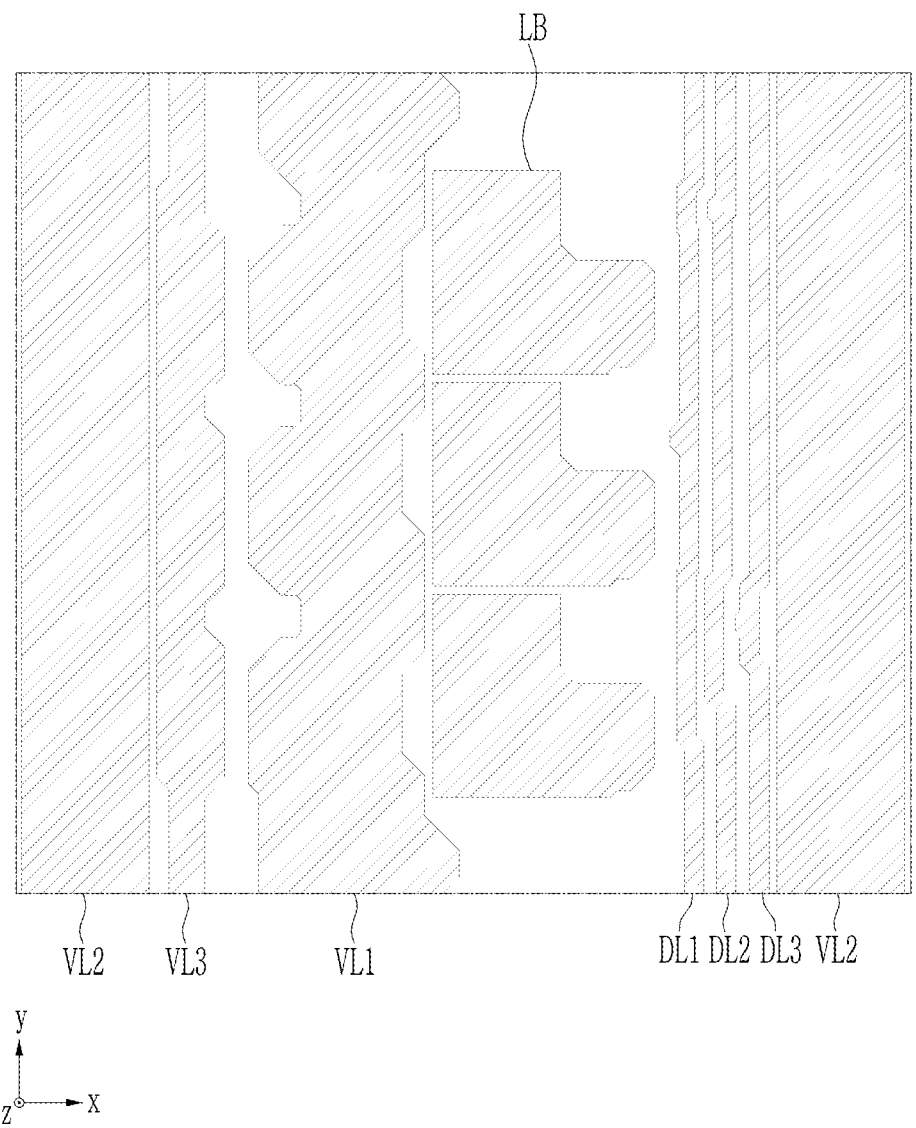
FIGS. 8 to 12 are schematic plan views showing an emissive display device shown in FIG. 3 according to a manufacturing sequence.

On the substrate 110, a first conductive layer 1000 (e.g., refer to FIG. 6) that may include data lines DL1, DL2, and DL3, a driving voltage line VL1, a common voltage line VL2, an initialization voltage line VL3, a light blocking pattern LB, and the like may be disposed. In FIG. 8, the first conductive layer 1000 is illustrated.

The data lines DL1, DL2, and DL3 may include a first data line DL1 transmitting the data voltage $V_{DATA}$ to the first pixel PX1, a second data line DL2 transmitting the data voltage $V_{DATA}$ to the second pixel PX2, and a third data line DL3 transmitting the data voltage $V_{DATA}$ to the third pixel PX3. The first data line DL1, the second data line DL2, and the third data line DL3 may be disposed adjacent to each other in the first direction x and may extend in the second direction y.

The driving voltage line VL1 may transmit the driving voltage $EL_{VDD}$. The common voltage line VL2 may transmit the common voltage $EL_{VSS}$. The initialization voltage line VL3 may transmit the initialization voltage $V_{INT}$. The driving voltage line VL1, the common voltage line VL2, and the initialization voltage line VL3 may each extend in the second direction y.

The common voltage line VL2, the initialization voltage line VL3, the driving voltage line VL1, and the data lines DL1, DL2, and DL3 may be repeatedly disposed along the first direction x. Accordingly, in the first direction x, the driving voltage line VL1 may be disposed between the initialization voltage line VL3 and the data lines DL1, DL2, and DL3, the common voltage line VL2 may be disposed between the data lines DL1, DL2, and DL3 and the initialization voltage line VL3, and the initialization voltage line VL3 may be disposed between the common voltage line VL2 and the driving voltage line VL1. The relative arrangement between the voltage lines VL1, VL2, and VL3 and the data lines DL1, DL2, and DL3 may be variously changed.

The light blocking pattern LB may be disposed between the driving voltage line VL1 and the data lines DL1, DL2, and DL3. The light blocking pattern LB may prevent external light from reaching the semiconductor layer A1 of the first transistor T1. Thus, deterioration of the semiconductor layer A1 may be prevented. By the light blocking pattern LB, it is possible to control the leakage current of the first transistor T1, particularly the driving transistor whose current characteristic is important in the emissive display device. The light blocking pattern LB may function as an electrode to which a voltage (e.g., a specific or selectable voltage) is applied. A current change rate in a saturation region of a voltage-current characteristic graph of the first transistor T1 may be reduced, and the characteristic of the driving transistor may be improved.

A buffer layer 120 may be disposed on the first conductive layer 1000. When the semiconductor layers A1, A2, and A3 are formed, the buffer layer 120 may block an impurity from the substrate 110 to improve the characteristics of the semiconductor layers A1, A2, and A3 and may planarize the surface of the substrate 110 to smooth the stress of the semiconductor layers A1, A2, and A3. The buffer layer 120 may include an inorganic insulating material including at least one of a silicon nitride ($SiN_x$), a silicon oxide ($SiO_x$), and a silicon oxynitride ($SiO_xN_y$). The buffer layer 120 may include amorphous silicon.

Figure 9:
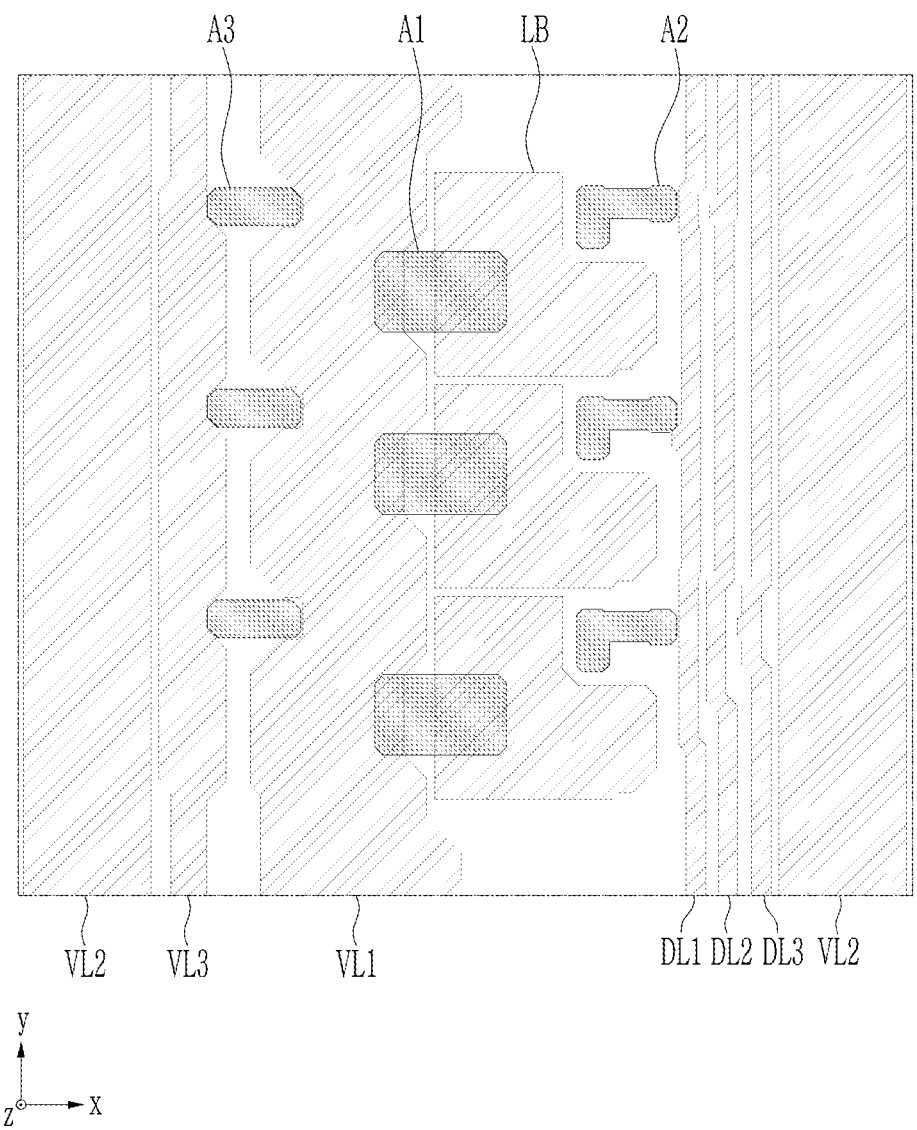

On the buffer layer 120, the semiconductor layers A1, A2, and A3 may be disposed. FIG. 9 shows the first conductive layer 1000 and the semiconductor layers A1, A2, and A3.

The semiconductor layers A1, A2, and A3 may include a semiconductor layer A1 of the first transistor T1, a semiconductor layer A2 of the second transistor T2, and a semiconductor layer A3 of the third transistor T3. The Each of the semiconductor layer layers A1, A2, and A3 may include a first region, a second region, and a channel region between the first region and the second region. The semiconductor layers A1, A2, and A3 may have a planar shape that is longer in the first direction x than in the second direction y. The first region of the semiconductor layer A1 may overlap the driving voltage line VL1 and may be electrically connected to the driving voltage line VL1. The second region and the channel region of the semiconductor layer A1 may overlap the light blocking pattern LB. The first region of the semiconductor layer A2 may be electrically connected to a corresponding data line among the data lines DL1, DL2, and DL3. For example, the first region of the semiconductor layer A1 of the first pixel PX1 may be electrically connected to the first data line DL1, the first region of the semiconductor layer A2 of the second pixel PX2 may be electrically connected to the second data line DL2, and the first region of the semiconductor layer A3 of the third pixel PX3 may be electrically connected to the third data line DL3. The second region of the semiconductor layer A2 may be electrically connected to a first storage electrode C1 of the storage capacitor $C_{ST}$. The first region of the semiconductor layer A3 may be electrically connected to the initialization voltage line VL3. The second region of the semiconductor layer A3 may be electrically connected to the second storage electrode C2 of the storage capacitor $C_{ST}$.

The semiconductor layers A1, A2, and A3 may include an oxide semiconductor. For example, the semiconductor layers A1, A2, and A3 may include oxide semiconductors such as IGZO (indium-gallium-zinc oxide) including at least one of zinc (Zn), indium (In), gallium (Ga), tin (Sn), and mixtures thereof. The semiconductor layers A1, A2, and A3 may include polycrystalline silicon or amorphous silicon (e.g., low temperature polysilicon (LTPS)).

A first insulating layer 140 may be disposed on the semiconductor layers A1, A2, and A3. The first insulating layer 140 may be referred to as a gate insulating layer. The first insulating layer 140 may be formed in a region overlapping gate electrodes G1, G2, and G3, the first storage electrode C1, and auxiliary patterns AP1b and AP2b. The first insulating layer 140 may be etched during a photolithography process for forming the gate electrodes G1, G2, and G3, the first storage electrode C1, and the auxiliary patterns AP1b and AP2b. The first insulating layer 140 may be formed to substantially cover an entire area of the substrate 110. The first insulating layer 140 may be an inorganic insulating layer including an inorganic insulating material such as a silicon oxide, a silicon nitride, or a silicon oxynitride, and may be a single layer or multiple layers.

Figure 10:
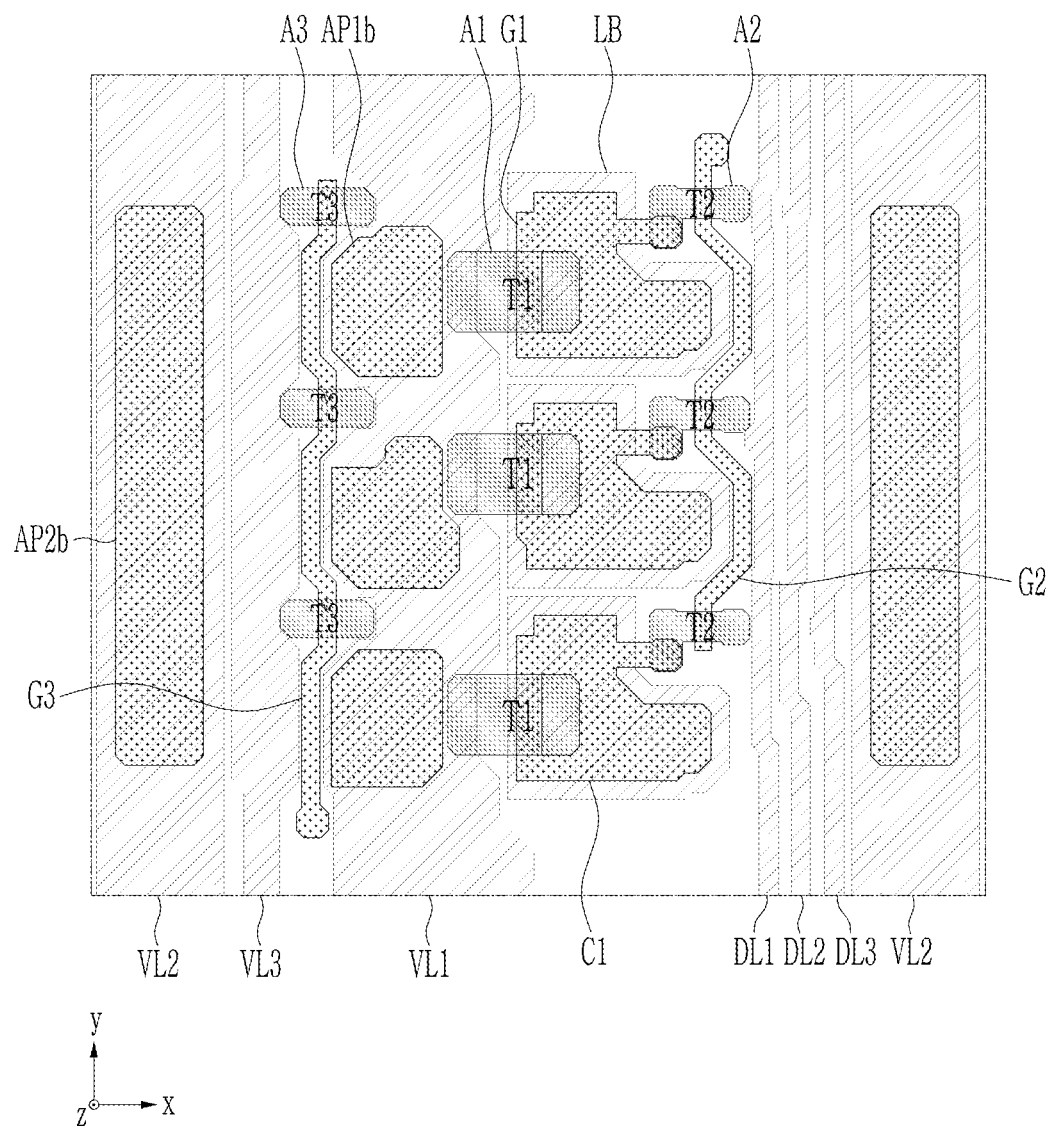

On the first insulating layer 140, a second conductive layer 2000 (e.g., refer to FIG. 6) including the gate electrode G1 of the first transistor T1, the gate electrode G2 of the second transistor T2, the gate electrode G3 of the third transistor T3, the first storage electrode C1 of the storage capacitor $C_{ST}$, the auxiliary pattern AP1b of the driving voltage line VL1, the auxiliary pattern AP2b of the common voltage line VL2, and the like may be disposed. FIG. 10 shows the first conductive layer 1000, the semiconductor layers A1, A2, and A3, and the second conductive layer 2000.

The gate electrodes G1, G2, and G3 may overlap the channel region of the corresponding semiconductor layers A1, A2, and A3. The gate electrode G1 may be electrically connected to the first storage electrode C1. The gate electrode G1 and the first storage electrode C1 may be integral with each other. The gate electrode G1 and the first storage electrode C1 may overlap the light blocking pattern LB. The first storage electrode C1 may be electrically connected to the second region of the semiconductor layer A2. The gate electrodes G2 of the second transistors T2 of the first pixel PX1, the second pixel PX2, and the third pixel PX3 may be electrically connected and integral with each other. The gate electrodes G2 of the second transistors T2 of the first pixel PX1, the second pixel PX2, and the third pixel PX3 may be extended (e.g., approximately extended) in the second direction y. The second transistors T2 of the first pixel PX1, the second pixel PX2, and the third pixel PX3 may receive the same first scan signal SC.

The gate electrodes G3 of the third transistors T3 of the first pixel PX1, the second pixel PX2, and the third pixel PX3 may be electrically connected and integral with each other. The gate electrodes G3 of the third transistors T3 of the first pixel PX1, the second pixel PX2, and the third pixel PX3 may extend (e.g., approximately extend) in the second direction y. The third transistors T3 of the first pixel PX1, the second pixel PX2, and the third pixel PX3 may receive the same second scan signal SS.

The auxiliary pattern AP1$b$ of the driving voltage line VL1 may overlap the driving voltage line VL1. The auxiliary pattern AP1$b$ may be disposed between the gate electrode G3 and the semiconductor layer A1 in the first direction x. Multiple auxiliary patterns AP1$b$ may be disposed in plural and spaced apart from each other in the second direction y. The auxiliary pattern AP1$b$ may be electrically connected to the driving voltage line VL1. Thus, the resistance of the driving voltage line VL1 and the RC delay of the driving voltage $EL_{VDD}$ may be reduced.

The auxiliary pattern AP2$b$ of the common voltage line VL2 may overlap the common voltage line VL2. In a plan view, the auxiliary pattern AP2$b$ may overlap the common voltage line VL2, and an entire area of the auxiliary pattern AP2$b$ may be disposed within the common voltage line VL2. The auxiliary pattern AP2$b$ may be formed long (or may extend) in the second direction y, and may be disposed between the first gate line GL1 and the second gate line GL2. The auxiliary pattern AP2$b$ may be repeatedly disposed in the second direction y. The auxiliary pattern AP2$b$ may be electrically connected to the common voltage line VL2. Thus, the resistance of the common voltage line VL2 and the RC delay of the common voltage $EL_{VSS}$ may be reduced.

A second insulating layer 150 may be disposed on the second conductive layer 2000. The second insulating layer 150 may be referred to as an interlayer insulating layer. The second insulating layer 150 may be an inorganic insulating layer including at least one inorganic insulating material such as a silicon oxide, a silicon nitride, or a silicon oxynitride, and may be a single layer or multiple layers.

Figure 11:
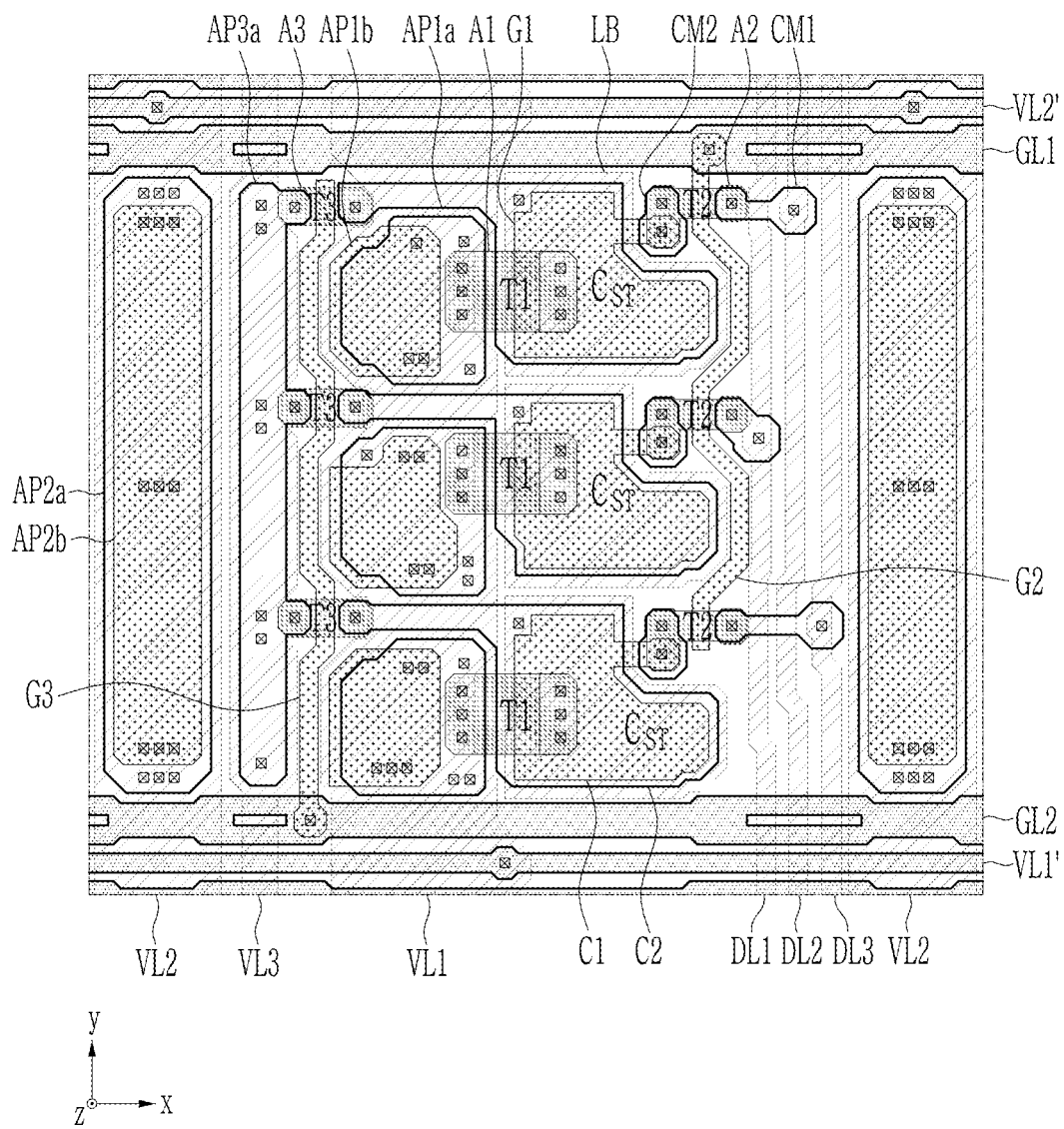

On the second insulating layer 150, a third conductive layer 3000 (e.g., refer to FIG. 6) including the first gate line GL1, the second gate line GL2, the second storage electrode C2 of the storage capacitor $C_{ST}$, an auxiliary driving voltage line VL1', an auxiliary common voltage line VL2', an auxiliary pattern AP1$a$ of the driving voltage line VL1, an auxiliary pattern AP2$a$ of the common voltage line VL2, an auxiliary pattern AP3$a$ of the initialization voltage line VL3, and the like may be disposed. FIG. 11 shows the first conductive layer 1000, the semiconductor layers A1, A2, and A3, the second conductive layer 2000, and the third conductive layer 3000.

The first gate line GL1 and the second gate line GL2 may extend in the first direction x. The first gate line GL1 may be electrically connected to the gate electrode G2 through a contact hole formed in the second insulating layer 150 and may apply a first scan signal SC. The second gate line GL2 may be electrically connected to the gate electrode G3 through a contact hole formed in the second insulating layer 150 and may apply a second scan signal SS.

The second storage electrode C2 of the storage capacitor $C_{ST}$ may overlap the first storage electrode C1 and may constitute the storage capacitor $C_{ST}$ together with the first storage electrode C1. The second storage electrode C2 may overlap the second region of the semiconductor layer A1, and the first storage electrode C1 may include an opening overlapping the second region of the semiconductor layer A1. The second storage electrode C2 may be electrically connected to the second region of the semiconductor layer A1 through the contact hole of the second insulating layer 150 and the opening of the first storage electrode C1. The second storage electrode C2 may be electrically connected to the light blocking pattern LB through a contact hole formed in the second insulating layer 150 and the buffer layer 120. Accordingly, the light blocking pattern LB, the first storage electrode C1, and the second storage electrode C2 may constitute a double storage capacitor $C_{ST}$. The second storage electrode C2 may include an extension portion that extends across the driving voltage line VL1 in the first direction x and overlaps the second region of the semiconductor layer A3. The extension portion may be electrically connected to the second region of the semiconductor layer A3 through a contact hole formed in the second insulating layer 150.

The auxiliary driving voltage line VL1' and the auxiliary common voltage line VL2' may be extended in the first direction x. The auxiliary driving voltage line VL1' may be electrically connected to the driving voltage line VL1 through a contact hole formed in the second insulating layer 150 and the buffer layer 120. The auxiliary common voltage line VL2' may be electrically connected to the common voltage line VL2 through a contact hole formed in the second insulating layer 150 and the buffer layer 120. Accordingly, the wirings that transmit the driving voltage $EL_{VDD}$ may be electrically connected in a mesh form in the display area DA, and the uniform driving voltage $EL_{VDD}$ may be provided throughout the display area DA. Also, the wirings that transmit the common voltage $EL_{VSS}$ may be electrically connected in a mesh form in the display area DA and may provide the uniform common voltage $EL_{VSS}$ throughout the display area DA.

The auxiliary pattern AP1$a$ of the driving voltage line VL1 may overlap the driving voltage line VL1 and the auxiliary pattern AP1$b$. The auxiliary pattern AP1$a$ may be disposed between the gate electrode G3 and the semiconductor layer A1 in the first direction x. Multiple auxiliary pattern AP1$a$ may be disposed in plural and spaced apart from each other in the second direction y. The auxiliary pattern AP1$a$ may be electrically connected to the driving voltage line VL1. Thus, the resistance of the driving voltage line VL1 and the RC delay of the driving voltage $EL_{VDD}$ may be reduced. The auxiliary pattern AP1$a$ may be electrically connected to the auxiliary pattern AP1$b$ through a contact hole formed in the second insulating layer 150. The auxiliary pattern AP1$a$ may be electrically connected to the driving voltage line VL1 through a contact hole formed in the second insulating layer 150 and the buffer layer 120, and may be electrically connected to the first region of the semiconductor layer A1 through a contact hole formed in the second insulating layer 150. Accordingly, the auxiliary pattern AP1b and the first transistor T1 may be electrically connected to the driving voltage line VL1 through the auxiliary pattern AP1a, respectively.

The auxiliary pattern AP2a of the common voltage line VL2 may overlap the common voltage line VL2 and the auxiliary pattern AP2b. In a plan view, the auxiliary pattern AP2a may overlap the common voltage line VL2, and an entire area of the auxiliary pattern AP2a may be disposed within the common voltage line VL2. The auxiliary pattern AP2a may overlap the auxiliary pattern AP2b and cover the entire area of the auxiliary pattern AP2b. The auxiliary pattern AP2a may be formed long (or extend) in the second direction y and may be disposed between the first gate line GL1 and the second gate line GL2. Multiple auxiliary patterns AP2a may be repeatedly disposed in the second direction y. The auxiliary pattern AP2a may be electrically connected to the common voltage line VL2. Thus, the resistance of the common voltage line VL2 and the RC delay of the common voltage $EL_{VSS}$ may be reduced. The auxiliary pattern AP2a may be electrically connected to the common voltage line VL2 through a contact hole formed in the second insulating layer 150 and the buffer layer 120, and may be electrically connected to the auxiliary pattern AP2b through a contact hole formed in the second insulating layer 150. Accordingly, the auxiliary pattern AP2b may be electrically connected to the common voltage line VL2 through the auxiliary pattern AP2a.

The auxiliary pattern AP3a of the initialization voltage line VL3 may overlap the initialization voltage line VL3. The auxiliary pattern AP3a may be formed long (or extend) in the second direction y and may be disposed between the first gate line GL1 and the second gate line GL2. Multiple auxiliary pattern AP3a may be repeatedly disposed in the second direction y. The auxiliary pattern AP3a may be electrically connected to the initialization voltage line VL3. Thus, the resistance of the initialization voltage line VL3 and the RC delay of the initialization voltage $V_{INT}$ may be reduced. The auxiliary pattern AP2a may be electrically connected to the initialization voltage line VL3 through the contact hole formed in the second insulating layer 150 and the buffer layer 120, and may be electrically connected to the first region of the semiconductor layer A3 through the contact hole formed in the second insulating layer 150. Accordingly, the third transistor T3 may be electrically connected to the initialization voltage line VL3 through the auxiliary pattern AP2a.

The third conductive layer 3000 may further include a connecting member CM1 and a connecting member CM2. The connecting member CM1 may electrically connect the data lines DL1, DL2, and DL3 and the first region of the semiconductor layer A2, and the connecting member CM2 may electrically connect the first storage electrode C1 of the storage capacitor $C_{ST}$ and the second region of the semiconductor layer A2. The connecting member CM1 may be electrically connected to the data lines DL1, DL2, and DL3 through the contact hole formed in the second insulating layer 150 and the buffer layer 120, and may be electrically connected to the first region of the semiconductor layer A2 through the contact hole formed in the second insulating layer 150. The connecting member CM2 may be electrically connected to the first storage electrode C1 through the contact hole formed in the second insulating layer 150, and may be electrically connected to the second region of the semiconductor layer A2 through the contact hole formed in the second insulating layer 150. Accordingly, the second transistor T2 may be electrically connected to the data lines DL1, DL2, and DL3 through the connecting member CM1, and may be electrically connected to the first storage electrode C1 through the connecting member CM2.

The third insulating layer 160 may be disposed on the third conductive layer 3000. The third insulating layer 160 may be referred to as a passivation layer. The third insulating layer 160 may be an inorganic insulating layer including an inorganic insulating material such as a silicon oxide, a silicon nitride, or a silicon oxynitride, and may be a single layer or multiple layers.

The first organic insulating layer 170 may be disposed on the third insulating layer 160. The first organic insulating layer 170 may be referred to as a planarization layer. The first organic insulating layer 170 may include an organic insulating material such as a general-purpose polymer such as poly(methyl methacrylate) and polystyrene, a derivative of a polymer having a phenolic group, an acryl-based polymer, an imide-based polymer (e.g., a polyimide), and a siloxane-based polymer.

Figure 12:
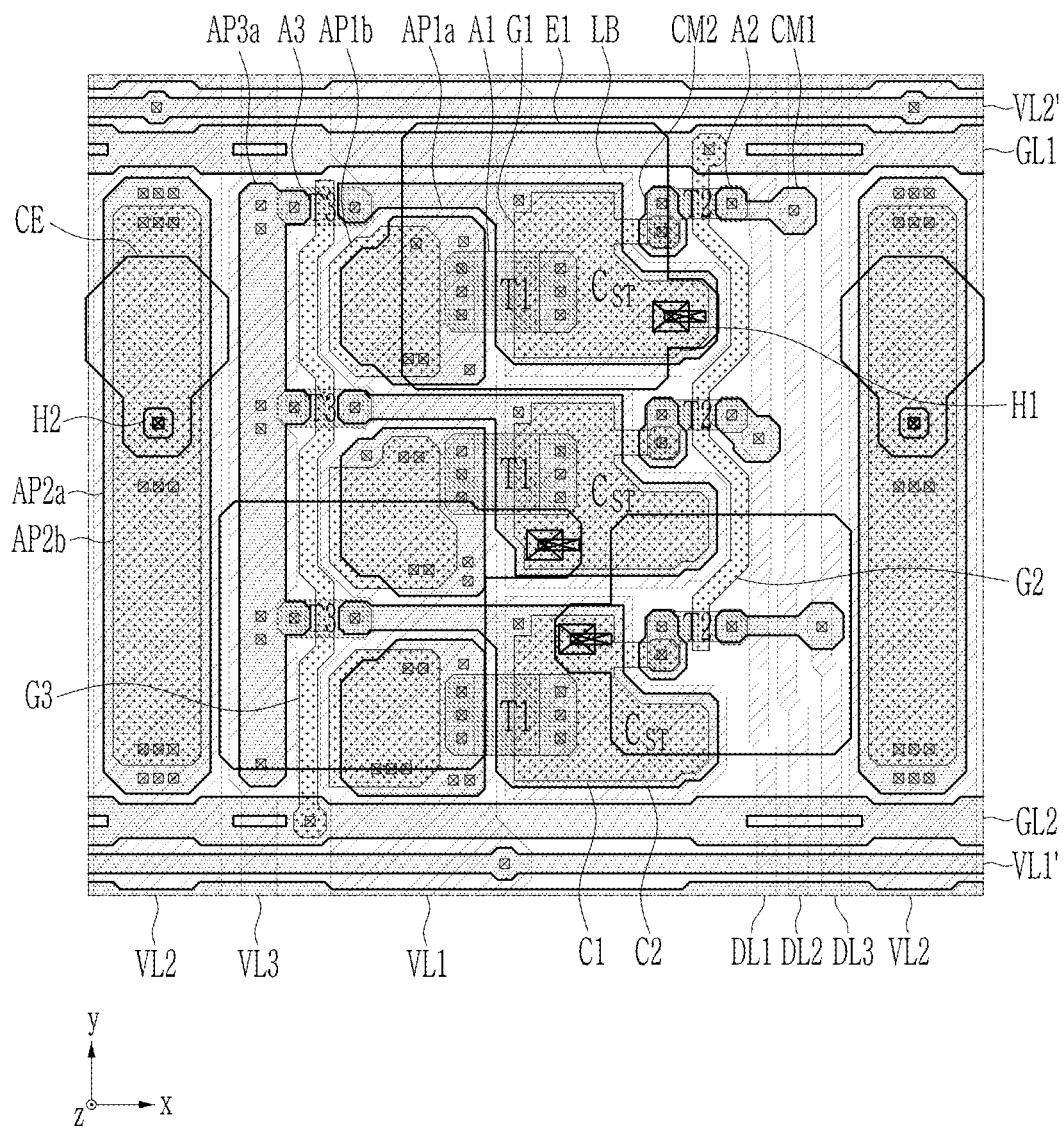

On the first organic insulating layer 170, a fourth conductive layer of the light emitting diode LED may be disposed. The fourth conductive layer may include a pixel electrode E1, a connection electrode CE, etc. FIG. 12 shows the first conductive layer 1000, the semiconductor layers A1, A2, and A3, the second conductive layer 2000, the third conductive layer 3000, and the fourth conductive layer.

The pixel electrode E1 may be electrically connected to the second storage electrode C2 through a contact hole H1 formed in the first organic insulating layer 170 and the third insulating layer 160. The pixel electrode E1 may be electrically connected to the second region of the semiconductor layer A1 through the second storage electrode C2.

The connection electrode CE may overlap the common voltage line VL2 and the auxiliary patterns AP2a and AP2b. The connection electrode CE may be electrically connected to the auxiliary pattern AP2a of the common voltage line VL2 through a contact hole H2 formed in the first organic insulating layer 170 and the third insulating layer 160. The contact hole H2 may be spaced apart from an opening OP1 in the second direction y.

In a plan view, the connection electrode CE may include a portion formed in an octagonal shape (e.g., approximately octagonal shape) and a portion protruded from a side of the portion of the octanal shape toward the contact hole H2.

The fourth conductive layer may be formed of a reflective conductive material or a semi-transmissive conductive material, or may be formed of a transparent conductive material. The pixel electrode E1 may include a transparent conductive material such as an indium tin oxide (ITO) or an indium zinc oxide (IZO). The pixel electrode E1 may include a metal such as lithium (Li), calcium (Ca), aluminum (Al), silver (Ag), magnesium (Mg), or gold (Au). The pixel electrode E1 may have a multi-layered structure. For example, the pixel electrode E1 may have a triple layer structure such as ITO/silver (Ag)/ITO.

A second organic insulating layer 180 may be disposed on the fourth conductive layer. The second organic insulating layer 180 may be referred to as a pixel defining layer. The second organic insulating layer 180 may include at least one organic insulating material of an acryl-based polymer, an imide-based polymer, and an amide-based polymer. The second organic insulating layer 180 may include a black pigment. For example, the second organic insulating layer 180 may include a polyimide binder, a red pigment, a green pigment, and a blue pigment. The second organic insulating layer 180 may include a cardo binder resin and a mixture of a lactam black pigment and a blue pigment. The second organic insulating layer 180 may include carbon black. The second organic insulating layer 180 including a black pigment may improve a contrast ratio and prevent a reflection of light by the underlying metal layer.

The second organic insulating layer 180 may cover an edge of the pixel electrode E1 and an edge of the connection electrode CE. The second organic insulating layer 180 may be removed from the region except for the region covering the edge of pixel electrode E1 and the edge of the connection electrode CE. For example, the second organic insulating layer 180 may cover the edge of the pixel electrode E1 and the edge of the connection electrode CE. The second organic insulating layer 180 may have an opening OP overlapping the pixel electrode E1 and the opening OP1 overlapping the connection electrode CE. The openings OP and OP1 may be regions in which the second organic insulating layer 180 is removed in a third direction z, which is the thickness direction.

An emission layer EL may be disposed on the fourth conductive layer. The emission layer EL may be disposed throughout the pixels PX1, PX2, and PX3. The emission layer EL may be continuously disposed over the entire display area DA. The emission layer EL may be in contact with the pixel electrode E1 through the opening OP of the second organic insulating layer 180. The emission layer EL may have a contact hole H3 overlapping the opening OP1. The contact hole H3 may overlap the common voltage line VL2 and the auxiliary patterns AP2a and AP2b. In a plan view, the contact hole H3 may be disposed within the opening OP1. The contact hole H3 may have a narrower width than the opening OP1. The contact hole H3 may have a circular or elliptical planar shape, but is not limited thereto.

The emission layer EL may include a light emitting material that emits blue light. The emission layer EL may include a light emitting material that emits red light or green light in addition to blue light. For example, the emission layer EL may include a light emitting material that emits the blue light and the red light or a light emitting material that emits the blue light and the green light. The emission layer EL may include emission layers. The emission layers may include emission layers emitting light of a same color or other emission layers emitting light of different colors. For example, the emission layer EL may have a structure in which three blue emission layers are stacked each other. As another example, the emission layer EL may have a structure in which three blue emission layers and a green emission layer are stacked each other. On the pixel electrode E1, in addition to the emission layer EL, at least one of a hole injection layer, a hole transport layer, an electron transport layer, and an electron injection layer may be disposed. For example, the at least one of the hole injection layer, the hole transport layer, the electron transport layer, and the electron injection layer may be disposed on (or disposed under) the pixel electrode E1 and/or the emission layer EL.

The common electrode E2 may be disposed on the emission layer EL. The common electrode E2 may be disposed over the pixels PX1, PX2, and PX3. The common electrode E2 may be continuously disposed over the entire display area DA. The common electrode E2 may be electrically connected to the connection electrode CE through the contact hole H3 formed in the emission layer EL. Since the connection electrode CE is electrically connected to the common voltage line VL2, the common electrode E2 may be electrically connected to the common voltage line VL2 through the connection electrode CE. Thus, the connection electrode CE may receive the common voltage $EL_{VSS}$. Accordingly, the common electrode E2 may receive the common voltage $EL_{VSS}$ uniformly over the entire display area DA, and a voltage drop due to the resistance of the common electrode E2 may be improved (or decreased), and an occurrence of a luminance deviation in the display area DA may be prevented.

The contact hole H3 may be formed in the emission layer EL and electrically connect the common electrode E2 to the connection electrode CE. The contact hole H3 may be formed by a laser drilling process. For example, a laser may be irradiated and the emission layer EL overlapping the opening OP1 may be removed after the forming of the emission layer EL. Thus, the contact hole H3 penetrating the emission layer EL in the third direction z, which is the thickness direction, may be formed. Accordingly, the connection electrode CE overlapping the contact hole H3 may be exposed. In case that the common electrode E2 is formed, the common electrode E2 may be electrically connected to the connection electrode CE through the contact hole H3.

The common electrode E2 may include a metal such as calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), or lithium (Li). The common electrode E2 may include a transparent conductive oxide such as an indium tin oxide (ITO) or an indium zinc oxide (IZO). The common electrode E2 may have a multi-layered structure, and may have a double-layered structure such as, for example, magnesium (Mg)/silver (Ag).

The pixel electrode E1, the emission layer EL, and the common electrode E2 may constitute the light emitting diode LED. The light emitting diode LED may be an organic light emitting diode. The pixel electrode E1 may be provided individually for each of the pixels PX1, PX2, and PX3 and receive a driving current. The common electrode E2 may be provided in common to the pixels PX1, PX2, and PX3 and receive a common voltage. The pixel electrode E1 may be an anode serving as a hole injection electrode, and the common electrode E2 may be a cathode serving as an electron injection electrode, and vice versa. The opening OP of the second organic insulating layer 180 may correspond to the light emitting region of the light emitting diode LED.

An encapsulation layer 190 may be disposed on the common electrode E2. The encapsulation layer 190 may seal the light emitting diodes (LEDs) and may prevent penetration of moisture or oxygen from the outside. The encapsulation layer 190 may cover the entire display area DA, and the edge of the encapsulation layer 190 may be disposed in the non-display area NA.

The encapsulation layer 190 may be a thin film encapsulation layer including a first inorganic layer 191, an organic layer 192, and a second inorganic layer 193. The first inorganic layer 191 and the second inorganic layer 193 may mainly prevent penetration of moisture, etc., and the organic layer 192 may mainly planarize a surface of the encapsulation layer 190, particularly the surface of the second inorganic layer 193 in the display area DA. The first inorganic layer 191 and the second inorganic layer 193 may include an inorganic insulating material such as a silicon oxide and a silicon nitride. The organic layer 192 may include an organic material such as an acryl-based resin, a methacrylic resin, polyisoprene, a vinyl-based resin, an epoxy-based resin, a urethane-based resin, a cellulose-based resin, or a perylene-based resin.

The first inorganic layer 191 and the second inorganic layer 193 may be formed wider than the organic layer 192. The first inorganic layer 191 and the second inorganic layer 193 may be in contact with or may be near the edge of the encapsulation layer 190. An edge of the first inorganic layer 191 and an edge of the second inorganic layer 193 may approximately coincide. By forming the first inorganic layer 191 and the second inorganic layer 193 widely, the penetration of moisture or oxygen from the side of the display area DA may be prevented, and the penetration may be delayed by making the penetration path of moisture or oxygen long and complicated.

As described above, for the electrical connection of the signal lines disposed in the different layers, the contact holes overlapping the first conductive layer 1000 may be formed in the second insulating layer 150 and the buffer layer 120, the contact holes overlapping the second conductive layer 2000 may be formed in the second insulating layer 150, and the contact holes H1 and H2 overlapping the third conductive layer 3000 may be formed in the third insulating layer 160 and the first organic insulating layer 170.

Referring to FIGS. 5 to 7 along with FIGS. 3 and 4, the pixel electrode E1 and the second storage electrode C2 may be electrically connected to each other through the contact hole H1 formed in the first organic insulating layer 170 and the third insulating layer 160. The contact hole H1 may include a first sub-contact hole Ha formed in the third insulating layer 160 and a second sub-contact hole Hb formed in the first organic insulating layer 170. A thickness of the first organic insulating layer 170 may be greater than a thickness of the third insulating layer 160, and a surface of the first organic insulating layer 170 may be almost flat except for the second sub-contact hole Hb.

The first sub-contact hole Ha formed in the third insulating layer 160 may include two first edges Ea facing each other and extending in a long side direction DRa and two second edges Eb facing each other and extending in a short side direction DRb that is almost perpendicular to the long side direction Dra. The first sub-contact hole Ha may have a rectangular planar shape of which a length La1 of the first edge Ea is greater than a length Lb1 of the second edge Eb. The length La1 of the first edge Ea may be at least about 1.5 times the length Lb1 of the second edge Eb.

The two first edge Ea of first sub-contact hole Ha may have a taper angle of a first angle θa. The two second edges Eb of the first sub-contact hole Ha may have a taper angle of a second angle θb. The first angle θa and the second angle θb may be smaller than about 90 degrees, and the first angle θa may be smaller than the second angle θb.

In the forming of the first sub-contact hole Ha, a photosensitive layer may be stacked (or disposed) on the third insulating layer 160 and exposed to form a photosensitive pattern. The third insulating layer 160 may be etched using the photosensitive pattern as an etching mask. The length La1 of the two first edges Ea of the first sub-contact hole Ha may be greater than the length Lb1 of the two second edges Eb. In an exposure process during the photosensitive pattern formation process, an amount of light reflected from the surface of the third conductive layer 3000 disposed under the first edge Ea having the long length may be greater than an amount of light reflected from the surface of the third conductive layer 3000 disposed under the second edge Eb having the short length.

Therefore, the exposure amount applied to the photosensitive pattern that may form the first edge Ea of the long length may increase. Thus, the height of the photosensitive pattern may be lowered, and the etching amount of the first edge Ea of the first sub-contact hole Ha may be increased. Therefore, the taper angle of the first edge Ea of the first sub-contact hole Ha may be smaller than the taper angle of the second edge Eb of the first sub-contact hole Ha.

Thus, the first sub-contact hole Ha may be formed in the form of a rectangle including the first edge Ea of two long sides and the second edge Eb of two short sides, and the size of the first angle θa, which is the taper angle of the long first edge Ea of the first sub-contact hole Ha, may be formed small. Therefore, the overall taper angle of the first sub-contact hole Ha may be reduced.

The second sub-contact hole Hb formed in the first organic insulating layer 170 may include two third edges Ea1 parallel to the first edge Ea of two long sides of the first sub-contact hole Ha and two fourth edges Eb1 parallel to the second edge Eb of two short sides of the first sub-contact hole Ha. A length La2 of the third edge Ea1 of the second sub-contact hole Hb may be the same as the length La1 of the first edge Ea of the first sub-contact hole Ha or greater than the length La1 of the first edge Ea, and the length Lb2 of the fourth edge Eb1 of the second sub-contact hole Hb may be greater than the length Lb1 of the second edge Eb of the first sub-contact hole Ha. However, the disclosure is not limited thereto.

The part of the fourth edge Eb1 parallel to the second edge Eb of two short sides of the first sub-contact hole Ha among the edge of the second sub-contact hole Hb is disposed within the first sub-contact hole Ha, thereby the first organic insulating layer 170 may cover the part of the second edge Eb of two short sides of the first sub-contact hole Ha. Since the organic insulating layer has a reflow property when forming the contact hole, the taper angle of the contact hole formed in the organic insulating layer may be low and gentle. The organic insulating layer having the gentle taper angle may cover the part of the second edge Eb, which is two short sides of the first sub-contact hole Ha, and the taper angle of the edge of the contact hole H1 may be formed gently.

As such, at least one edge of the second edge Eb, which is two short sides having the second angle θb with the large taper angle among the first sub-contact hole Ha, is covered with the first organic insulating layer 170, the taper angle of the contact hole H1 including the first sub-contact hole Ha and the second sub-contact hole Hb may be formed smaller.

Therefore, by gently forming the taper angle of the contact hole H1, the fourth conductive layer formed on the first sub-contact hole Ha and including the pixel electrode E1 and the second storage electrode C2 may be prevented from being disconnected due to the large taper angle of the first sub-contact hole Ha.

Figure 13:
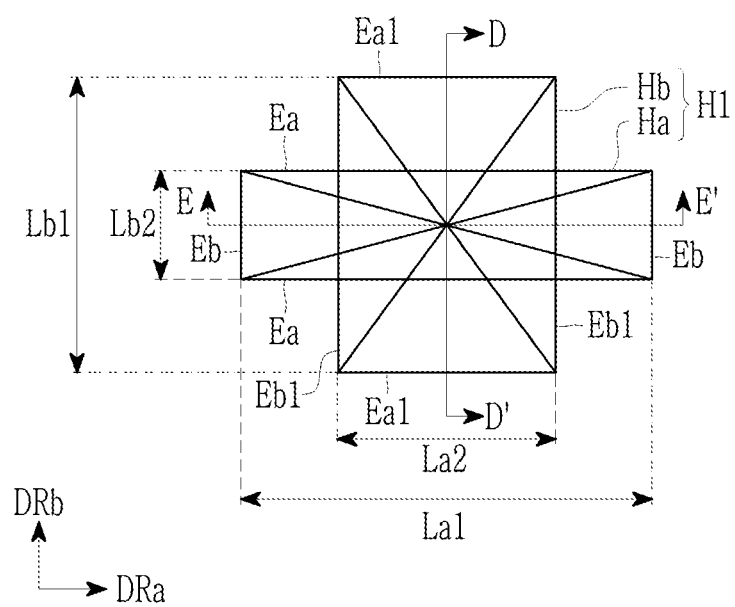
FIG. 13 is a schematic enlarged view showing a part of a display device according to another embodiment.
Figure 14:
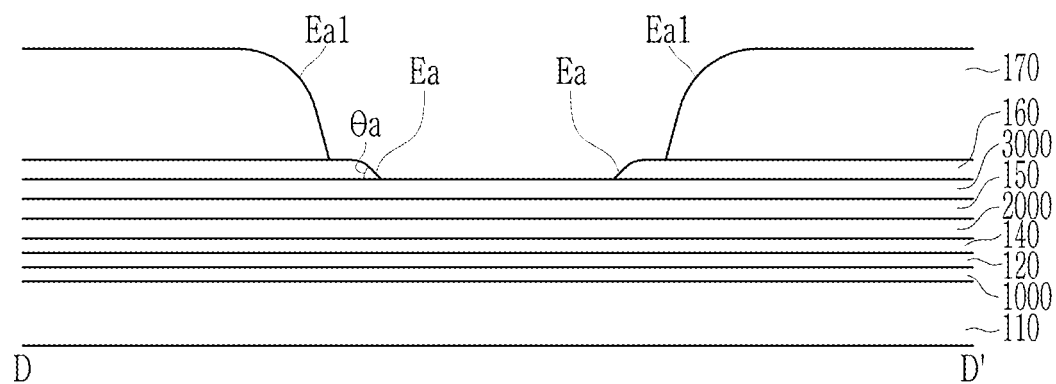
FIG. 14 is a schematic cross-sectional view taken along line D-D' of FIG. 13.
Figure 15:
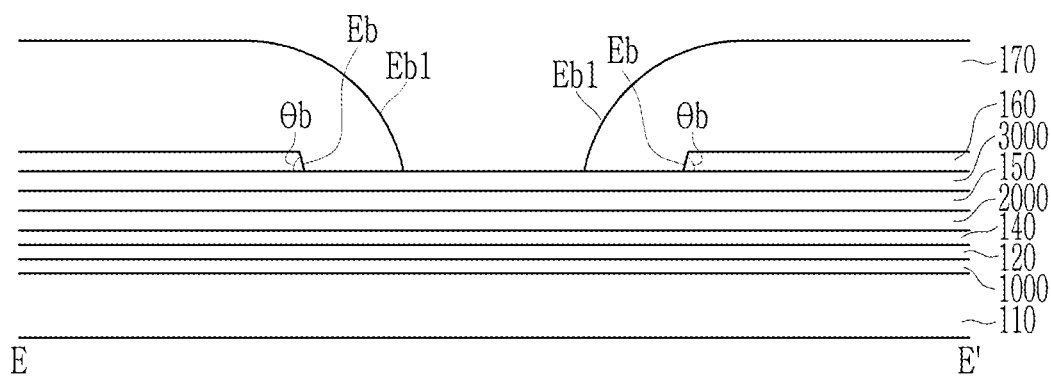
FIG. 15 is a schematic cross-sectional view taken along line E-E' of FIG. 13.

The contact hole of the display device according to another embodiment is described with reference to FIGS. 13 to 15. FIG. 13 is a schematic enlarged view showing a part of a display device according to another embodiment. FIG. 14 is a schematic cross-sectional view taken along line D-D' of FIG. 13. FIG. 15 is a schematic cross-sectional view taken along line E-E' of FIG. 13.

Referring to FIGS. 13 to 15, the contact hole H1 of the display device according to the embodiment is almost similar to the contact hole H1 of the display device according to the embodiment described above. A detailed description of the same constituent elements is omitted.

The contact hole H1 includes a first sub-contact hole Ha formed in the third insulating layer 160 and a second sub-contact hole Hb formed in the first organic insulating layer 170.

The first sub-contact hole Ha formed in the third insulating layer 160 may include two first edges Ea extending in the long side direction DRa and facing each other and two second edges Eb extending in the short side direction DRb vertical (e.g., approximately vertical) to the long side direction DRa and facing each other, and may have a planar shape of a rectangle of which the length La1 of the first edge Ea is greater than the length Lb1 of the second edge Eb. The length La1 of the first edge Ea may be at least about 1.5 times the length Lb1 of the second edge Eb.

Two first edges Ea of the first sub-contact hole Ha may have a taper angle of a first angle θa, two second edges Eb of the first sub-contact hole Ha may have a taper angle of a second angle θb, the first angle θa and the second angle θb may be smaller than 90 degrees, and the first angle θa may be smaller than the second angle θb.

As such, by forming the first sub-contact hole Ha in the form of a rectangle including the first edge Ea of two long sides and the second edge Eb of two short sides, the size of the first angle θa, which is the taper angle of the long first edge Ea of the first sub-contact hole Ha, may be formed small, and thus the overall taper angle of the first sub-contact hole Ha may be reduced.

The second sub-contact hole Hb formed in the first organic insulating layer 170 may include two third edges Ea1 parallel to the first edge Ea of two long sides of the first sub-contact hole Ha and two fourth edges Eb1 parallel to the second edge Eb of two short sides of the first sub-contact hole Ha.

Unlike the display device according to the embodiment described above, a length La2 of the third edge Ea1 of the second sub-contact hole Hb of the contact hole H1 of the display device according to the embodiment may be smaller than a length La1 of the first edge Ea of the first sub-contact hole Ha. A length Lb2 of the fourth edge Eb1 of the second sub-contact hole Hb may be greater than the length Lb1 of the second edge Eb of the first sub-contact hole Ha.

Also, among the edges of the second sub-contact hole Hb, a part of the two fourth edges Eb1 parallel to the second edge Eb, which are the two short sides of the first sub-contact hole Ha may be disposed in the first sub-contact hole Ha. Thus, the second edge Eb and the two short sides of the first sub-contact hole Ha may be covered with the first organic insulating layer 170. Thus, two second edges Eb, which are the short sides having the second angle θb with the large taper angle among the first sub-contact hole Ha, may be covered with the first organic insulating layer 170, and the taper angle of the contact hole H1 including the first sub-contact hole Ha and the second sub-contact hole Hb may be formed smaller.

Therefore, the taper angle of the contact hole H1 may be gently formed, and disconnection, which may be caused by a large taper angle of the first sub-contact hole Ha, between the fourth conductive layer formed on the first sub-contact hole Ha and including the pixel electrode E1 and the second storage electrode C2 may be prevented.

Figure 16:
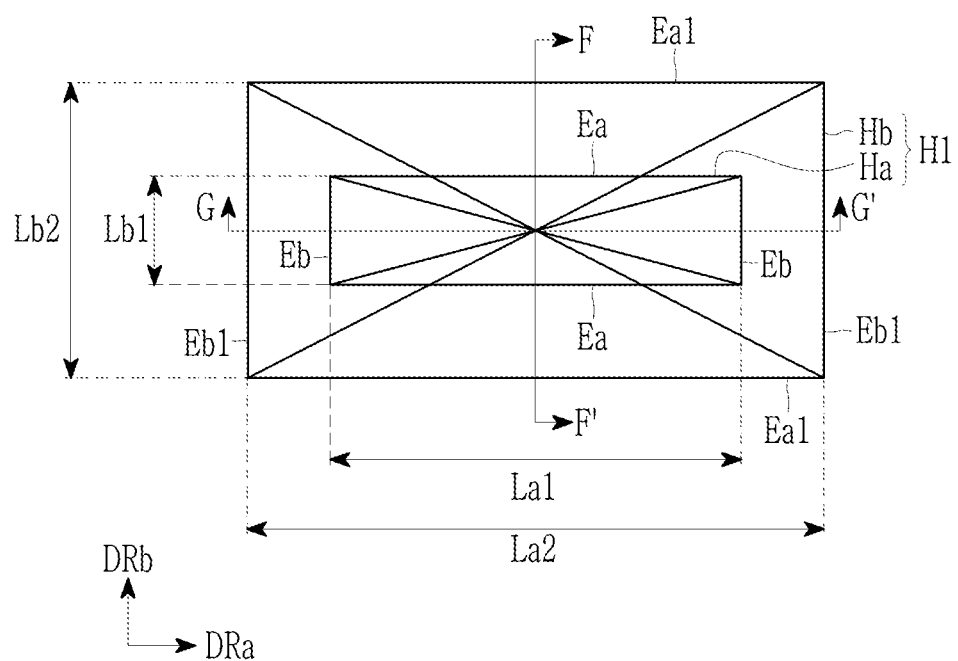
FIG. 16 is a schematic enlarged view showing a part of a display device according to another embodiment.
Figure 17:
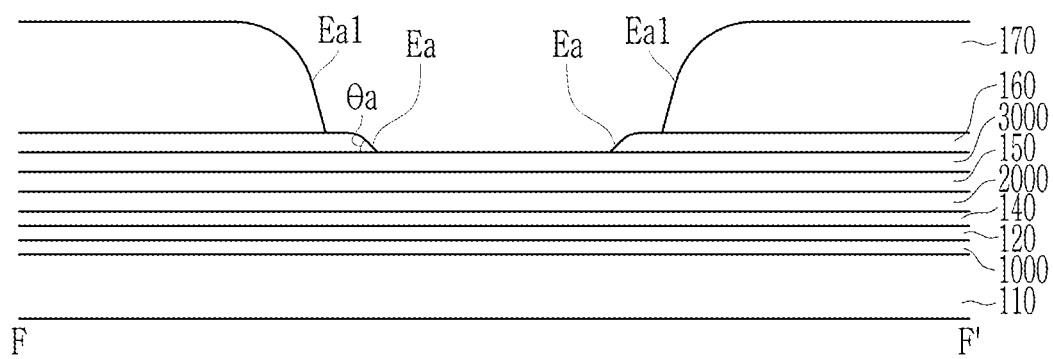
FIG. 17 is a schematic cross-sectional view taken along line F-F' of FIG. 16.
Figure 18:
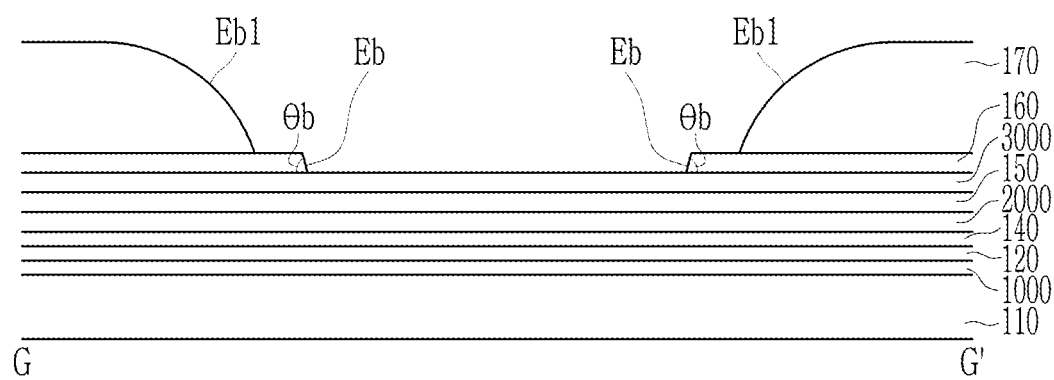
FIG. 18 is a schematic cross-sectional view taken along line G-G' of FIG. 16.

A contact hole of the display device according to another embodiment is described with reference to FIGS. 16 to 18. FIG. 16 is a schematic enlarged view showing a part of a display device according to another embodiment. FIG. 17 is a schematic cross-sectional view taken along line F-F of FIG. 16. FIG. 18 is a schematic cross-sectional view taken along line G-G' of FIG. 16.

Referring to FIGS. 16 to 18, the contact hole H1 of the display device according to the embodiment is almost similar to the contact hole H1 of the display device according to the embodiment described above. A detailed description of the same constituent elements is omitted.

The contact hole H1 may include a first sub-contact hole Ha formed in a third insulating layer 160 and a second sub-contact hole Hb formed in a first organic insulating layer 170.

The first sub-contact hole Ha formed in the third insulating layer 160 may include two first edges Ea extending in a long side direction DRa and facing each other and two second edges Eb extending in a short side direction DRb vertical (e.g., approximately vertical) to the long side direction DRa and facing each other. The first sub-contact hole Ha may have a planar shape of a rectangle of which a length La1 of the first edge Ea is greater than a length Lb1 of the second edge Eb. The length La1 of the first edge Ea may be at least about 1.5 times the length Lb1 of the second edge Eb.

The two first edges Ea of the first sub-contact hole Ha may have a taper angle of a first angle θa. The two second edges Eb of the first sub-contact hole Ha may have a taper angle of a second angle θb. The first angle θa and the second angle θb may be smaller than 90 degrees. The first angle θa may be smaller than the second angle θb.

Thus, the first sub-contact hole Ha may be formed in the form of a rectangle including the first edge Ea of two long sides and the second edge Eb of two short sides. A size of the first angle θa, which is the taper angle of the long first edge Ea of the first sub-contact hole Ha, may be formed small. Therefore, the overall taper angle of the first sub-contact hole Ha may be reduced.

The second sub-contact hole Hb formed in the first organic insulating layer 170 may include two third edges Ea1 parallel to the first edge Ea of two long sides of the first sub-contact hole Ha and two fourth edges Eb1 parallel to the second edge Eb of two short sides of the first sub-contact hole Ha.

Unlike the display device according to the embodiment described above, the length La2 of the third edge Ea1 of the second sub-contact hole Hb of the display device according to the embodiment may be greater than the length La1 of the first edge Ea of the first sub-contact hole Ha of the contact hole H1. The length Lb2 of the fourth edge Eb1 of the second sub-contact hole Hb may be greater than the length Lb1 of the second edge Eb of the first sub-contact hole Ha.

As described above, the taper angle of the contact hole H1 may be formed gently. A fourth conductive layer may be formed on the first sub-contact hole Ha and include a pixel electrode E1, and disconnection of a second storage electrode C2, which may be caused due to the large taper angle of the first sub-contact hole Ha, may be prevented.

Figure 19:
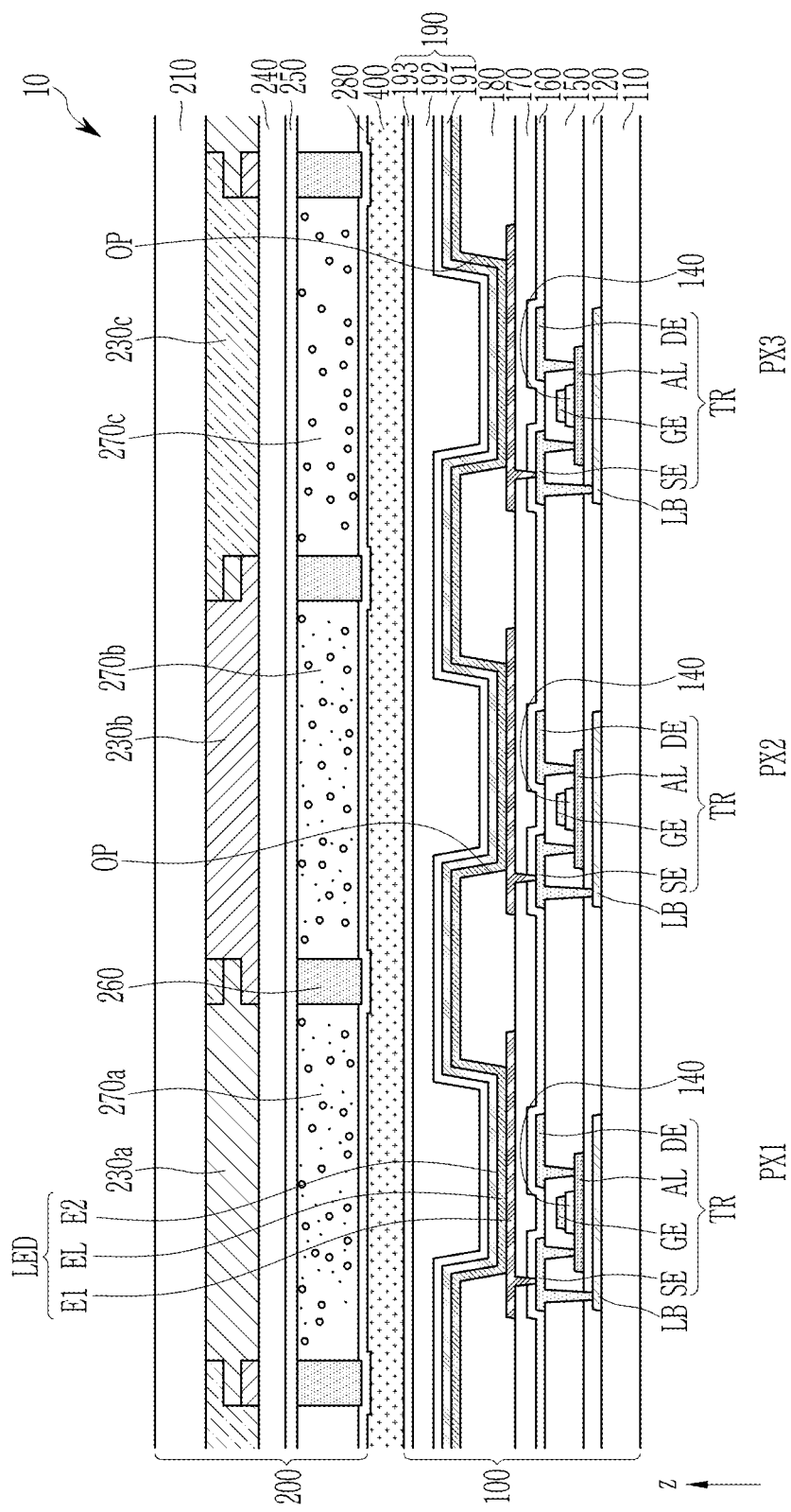
FIG. 19 is a schematic cross-sectional view of a display area in an emissive display device according to an embodiment.

The display device according to an embodiment is described with reference to FIG. 19. FIG. 19 is a schematic cross-sectional view of a display area in an emissive display device according to an embodiment.

Referring to FIG. 19, a display panel 10 may include a display part 100, a color conversion part 200, and a filler 400 disposed between the display part 100 and the color conversion part 200. The structure of the display part 100 of the display panel 10 may be similar to a structure of the display device according to the embodiment described above.

The display part 100 may include a substrate 110, a transistor TR formed on the substrate 110, and a light emitting diode LED electrically connected to the transistor TR. The transistor TR may include a semiconductor layer AL, a gate electrode GE, a first electrode SE, and a second electrode DE. The first electrode SE may be electrically connected to a first region of the semiconductor layer AL and a light blocking pattern LB, and the second electrode DE may be electrically connected to a second region of the semiconductor layer AL. The illustrated transistor TR may be a first transistor T1. Since the display part 100 has been described in detail above, description of the color conversion part 200 and the filler 400 is provided below.

The color conversion part 200 may be disposed on an encapsulation layer 190 of the display part 100.

The color conversion part 200 may include a substrate 210. The substrate 210 may include an insulating material such as glass or plastic. For example, the substrate 110 may be a glass substrate.

In the direction facing the display part 100, color filters 230a, 230b, and 230c may be disposed on the substrate 210. In the display area DA, the color filters 230a, 230b, and 230c may overlap the openings OP of the second organic insulating layer 180. The color filters 230a, 230b, and 230c may include a first color filter 230a that transmits light of a first wavelength and absorbs light of remaining wavelengths, a second color filter 230b that transmits light of a second wavelength and absorb light of remaining wavelengths, and a third color filter 230c that transmits light of a third wavelength and absorbs light of remaining wavelengths. The first color filter 230a, the second color filter 230b, and the third color filter 230c may overlap a first pixel PX1, a second pixel PX2, and a third pixel PX3, respectively. Accordingly, the purity of the light of the first wavelength (corresponding to the first pixel PX1), the light of the second wavelength (corresponding to the second pixel PX2), and the light of the third wavelength (corresponding to the third pixel PX3) emitted to the outside of the display panel 10 may be increased. The light of the first wavelength, the light of the second wavelength, and the light of the third wavelength may be red light, green light, and blue light, respectively.

At the boundary of the pixels PX1, PX2, and PX3, the first color filter 230a, the second color filter 230b, and the third color filter 230c may overlap each other to form a light blocking region. As illustrated, the first color filter 230a, the second color filter 230b, and the third color filter 230c may overlap and form a light blocking region. For example, the two color filters may overlap to form a light blocking region. For example, the first color filter 230a and the second color filter 230b may overlap at a boundary between the first pixel PX1 and the second pixel PX2. The second color filter 230b and the third color filter 230c may overlap at a boundary between the second pixel PX2 and the third pixel PX3. The third color filter 230c and the first color filter 230a may overlap at a boundary between the third pixel PX3 and the first pixel PX1. In the non-display area NA, the first color filter 230a, the second color filter 230b, and the third color filter 230c may overlap each other in a plan view to form a light blocking region. The third color filter 230c, the first color filter 230a, and the second color filter 230b may be stacked each other on the substrate 210 in the order. In other embodiments, the third color filter 230c, the first color filter 230a, and the second color filter 230b may be stacked each other in a different order. Instead of overlapping the color filters 230a, 230b, and 230c, a light blocking member may be formed to provide a light blocking region.

A low refractive index layer 240 may be disposed on the color filters 230a, 230b, and 230c. The low refractive index layer 240 may cover an entire area of the substrate 210. The low refractive index layer 240 may include an organic material or an inorganic material having a low refractive index. The refractive index of the low refractive index layer 240 may be in a range of about 1.1 to about 1.3. The low refractive index layer 240 may be disposed at a position different from the position shown in the drawings. For example, the low refractive index layer 240 may be disposed between the color conversion layers 270a and 270b and the second capping layer 280 and between the transmission layer 270c and the second capping layer 280. The color conversion part 200 may include low refractive index layers. The color conversion part 200 may include the low refractive index layer 240 disposed between the color filters 230a, 230b, and 230c, and the first capping layer 250. For example, the color conversion part 200, as described above, may further include another low refractive index layer disposed between the color conversion layers 270a and 270b and the second capping layer 280 and between the transmission layer 270c and the second capping layer 280. For example, the another low refractive index layer of the color conversion part 200 may be disposed between the color conversion layers 270a and 270b and the second capping layer 280 and between the transmission layer 270c and the second capping layer 280.

The first capping layer 250 may be disposed on the low refractive index layer 240. The first capping layer 250 may cover (e.g., completely cover) the low refractive index layer 240, and the low refractive index layer 240 may be protected. The first capping layer 250 may include an inorganic insulating material such as a silicon oxide, a silicon nitride, or a silicon oxynitride. For example, the first capping layer 250 may be a single layer or multiple layers.

A bank 260 may be disposed on the first capping layer 250. The bank 260 may be disposed in the display area DA and overlap the second organic insulating layer 180. The bank 260 may overlap the light blocking region in which the first color filter 230a, the second color filter 230b, and the third color filter 230c overlap. The bank 260 may be disposed at a boundary of the pixels PX1, PX2, and PX3. The bank 260 may partition a pixel area. The bank 260 may include an organic insulating material such as an acryl-based polymer, an imide-based polymer, or an amide-based polymer. The bank 260 may be a black bank including colored pigments such as black pigments, but may also be transparent.

A first color conversion layer 270a, a second color conversion layer 270b, and a transmission layer 270c may be disposed on the first capping layer 250. The first color conversion layer 270a, the second color conversion layer 270b, and the transmission layer 270c may be disposed in a space defined by the bank 260 (i.e., the opening of the bank 260). The first color conversion layer 270a, the second color conversion layer 270b, and the transmission layer 270c may be partitioned or separated by the bank 260. The first color conversion layer 270a, the second color conversion layer 270b, and the transmission layer 270c may be formed by an inkjet printing process.

The first color conversion layer 270a may overlap the first color filter 230a. The first color conversion layer 270a may overlap the light emitting diode LED corresponding to the first pixel PX1 and may convert light incident from the light emitting diode LED into light of a first wavelength. The light of the first wavelength may be red light having a maximum emission peak wavelength in a range of about 600 nm to about 650 nm, for example about 620 nm to about 650 nm.

The second color conversion layer 270b may overlap the second color filter 230b. The second color conversion layer 270b may overlap the light emitting diode LED corresponding to the second pixel PX2, and may convert light incident from the light emitting diode LED into light having a second wavelength. The light of the second wavelength may be green light having a maximum emission peak wavelength in a range of about 500 nm to about 550 nm, for example about 510 nm to about 550 nm.

The transmission layer 270c may overlap the third color filter 230c. The transmission layer 270c may overlap the light emitting diode LED corresponding to the third pixel PX3 and transmit light incident from the light emitting diode LED. The light passing through the transmission layer 270c may be light of the third wavelength. The light of the third wavelength may be blue light with a maximum emission peak wavelength in a range of about 380 nm to about 480 nm. For example, the light of the third wavelength may be blue light with a maximum emission park wavelength in a range of about 420 nm or more, about 430 nm or more, about 440 nm or more, or about 445 nm or more, and about 470 nm or less, about 460 nm or less, or about 455 nm or less.

The first color conversion layer 270a and the second color conversion layer 270b may include first quantum dots and second quantum dots, respectively. For example, light incident to the first color conversion layer 270a may be converted into light of the first wavelength by the first quantum dots and emitted. Light incident to the second color conversion layer 270b may be converted into light of the second wavelength by the second quantum dots and emitted. The first color conversion layer 270a, the second color conversion layer 270b, and the transmission layer 270c may include scatterers. The scatterers may scatter light incident to the first color conversion layer 270a, the second color conversion layer 270b, and the transmission layer 270c to improve light efficiency.

The first quantum dots and the second quantum dots (hereinafter, the quantum dot is referred to as a semiconductor nanocrystal) may each independently include a Group II-VI compound, a Group III-V compound, a Group IV-VI compound, a Group IV element or compound, a Group I-III-VI compound, a Group II-III-VI compound, a Group I-II-IV-VI compound, or any combination thereof.

The Group II-VI compound may be selected from a group including a binary compound, a ternary compound, and a quaternary compound. The binary compound of the Group II-VI compound may be selected from a group consisting of CdSe, CdTe, ZnS, ZnSe, ZnTe, ZnO, HgS, HgSe, HgTe, MgSe, and MgS. However, the disclosure is not limited thereto and the binary compound of the Group II-VI may include a mixture thereof. The ternary compound of the Group II-VI compound may be selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS. However, the disclosure is not limited thereto and the ternary compound of the Group II-VI may include a mixture thereof. The quaternary compound of the Group II-VI compound may be selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal.

The Group III-V compound may be selected from a group including a binary compound selected from a group consisting of GaN, GaP, GaAs, GaSb, AlN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (e.g., InZnP).

The Group IV-VI compound may be selected from a group including a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; and a quaternary compound selected from a group consisting of SnPbSSe, SnPbSeTe, SnPbSTe, and a mixture thereof.

The Group IV element or compound may be selected from a group including a single element compound selected from a group consisting of Si, Ge, and combinations thereof; and a binary element compound selected from a group consisting of SiC, SiGe, and combinations thereof.

The Group compound may be selected from a group including CuInSe2, CuInS2, CuInGaSe, and CuInGaS, however, the disclosure is not limited thereto.

The Group compound may be selected from a group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and combinations thereof.

The Group I-II-IV-VI compound may be selected from CuZnSnSe and CuZnSnS.

The quantum dot may not include cadmium. The quantum dots may include a semiconductor nanocrystal based on a Group III-V compound including indium and phosphorus. The Group III-V compound may further include zinc. The quantum dots may include a semiconductor nanocrystal based on a Group II-VI compound including a chalcogen element (e.g., sulfur, selenium, tellurium, or combinations thereof) and zinc.

In the quantum dots, the binary compound, the ternary compound, or the quaternary compound as described above may be present in the particle at a uniform concentration or in the same particle of which a concentration distribution may be partially divided into different states. Also, the quantum dots may have a core/shell structure in which one quantum dot surrounds another quantum dot. The interface between the core and the shell may have a concentration gradient in which the concentration of the elements in the shell decreases toward the center.

In some embodiments, the quantum dots may have a core-shell structure including a core including the above-described nanocrystal and a shell surrounding the core. The shell of the quantum dot may prevent a chemical modification of the core and/or a charging layer for imparting an electrophoretic characteristic to the quantum dot, and act as a protective layer for maintaining the semiconductor characteristic. The shell may be single-layered or multi-layered. The interface between the core and the shell may have a concentration gradient in which the concentration of elements presents in the shell decreases toward the center. Examples of the shell of the quantum dot may include a metal or non-metal oxide, a semiconductor compound, or a combination thereof.

For example, the metal or non-metal oxide may be, for example, a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO, or a ternary compound such as $MgAl_2O_4$, $CoFe_2O_4$, $NiFe_2O_4$, and $CoMn_2O_4$.

Examples of the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like.

The quantum dots may have a full width at half maximum (FWHM) of about 45 nm or less. For example, the full width at half maximum (FWHM) of the quantum dots may be about 40 nm or less. In an embodiment, the full width at half maximum (FWHM) of the quantum dots may be about 30 nm or less. The quantum dots may improve color purity or color reproducibility in this range. Also, since light emitted through the quantum dots is emitted in all directions, a wide viewing angle may be improved. For example, a viewing angle may be increased.

In the quantum dots, the shell material and the core material may have different energy bandgaps from each other. For example, an energy bandgap of the shell material may be greater than an energy bandgap of the core material. The quantum dots may have a multi-layered shell. In the multi-layered shell, the energy bandgap of the outer layer may be greater than the energy bandgap of the inner layer (i.e., the layer nearer or adjacent to the core). In the multi-layered shell, the energy bandgap of the outer layer may be less than the energy bandgap of the inner layer.

The shape of the quantum dot is not limited thereto. For example, the shape of the quantum dot may include a sphere, a polyhedron, a pyramid, a multipod, a square, a cuboid, a nanotube, a nanorod, a nanowire, a nanosheet, or a combination thereof.

The quantum dots may include an organic ligand (e.g., having a hydrophobic moiety). The organic ligand moiety may be bound to surfaces of the quantum dots. The organic ligand moiety may include RCOOH, RNH2, R2NH, R3N, RSH, R3PO, R3P, ROH, RCOOR, RPO(OH)2, RHPOOH, R2POOH, or combinations thereof. Herein, R is independently a C3 to C40 substituted or unsubstituted aliphatic hydrocarbon group such as a C3 to C40 (e.g., C5 or greater and C24 or smaller) substituted or unsubstituted alkyl, or a substituted or unsubstituted alkenyl, a C6 to C40 (e.g., C6 or greater and C20 or smaller) substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; a phosphine compound or an oxide compound thereof such methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, or trioctyl phosphine oxide; a diphenyl phosphine, a triphenyl phosphine compound, or an oxide compound thereof; and a C5 to C20 alkyl phosphonic acid such as hexylphosphinic acid, octylphosphinic acid, dodecanephosphinic acid, tetradecanephosphinic acid, hexadecanephosphinic acid, or octadecanephosphinic acid. The quantum dots may include a hydrophobic organic ligand alone or in a mixture of at least two types. The hydrophobic organic ligand may not include a photopolymerizable moiety (e.g., an acrylate group, a methacrylate group, etc.).

A second capping layer 280 may be disposed on the bank 260. The second capping layer 280 may be disposed to completely cover the substrate 210. The second capping layer 280 may cover the first color conversion layer 270a, the second color conversion layer 270b, and the transmission layer 270c. The second capping layer 280 may include an inorganic insulating material such as a silicon oxide, a silicon nitride, or a silicon oxynitride, and may be a single layer or multiple layers.

The low refractive index layer 240, the first capping layer 250, and the second capping layer 280 may cover side surfaces of the color filters 230a, 230b, and 230c at an edge of the color conversion part 200. The low refractive index layer 240, the first capping layer 250, and the second capping layer 280 may be formed up to an edge of the substrate 210, and the low refractive index layer 240 may be in contact with the substrate 210 at the edge of the color conversion part 200. The low refractive index layer 240, the first capping layer 250, and the second capping layer 280 may form a blocking member that prevents penetration of moisture, oxygen, etc. from the edge of the color conversion part 200.

A filler 400 may be disposed between the color conversion part 200 and the display part 100. The filler 400 may fill a space between the display part 100 and the color conversion part 200 and increase a compression resistance between the display part 100 and the color conversion part 200. A surface of the filler 400 may be in contact with the second capping layer 280, and another surface of the filler 400 may be in contact with the encapsulation layer 190. The filler 400 may be formed by applying a filling material on the second capping layer 280 overlapping the display unit 100, and curing the filling material. The filler 400 may include an organic material such as an epoxy resin.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:
   a first wiring layer on a substrate;
   a first insulating layer on the first wiring layer and including an inorganic material;
   a second insulating layer on the first insulating layer and including an organic material; and
   a second wiring layer on the second insulating layer and electrically connected to the first wiring layer through a contact hole of the first insulating layer and the second insulating layer, wherein
   a thickness of the second insulating layer is greater than a thickness of the first insulating layer, the contact hole includes:
a first sub-contact hole in the first insulating layer; and
a second sub-contact hole in the second insulating layer,
at least part of at least one edge of the first sub-contact hole is covered with the second insulating layer,
the at least one edge of the first sub-contact hole includes two first edges parallel to each other and two second edges parallel to each other, and
a taper angle between each of the two first edges and a surface of the substrate is less than a taper angle between each of the two second edges and the surface of the substrate.

2. The display device of claim 1, wherein
a length of each of the two first edges is greater than a length of each of the two second edges.

3. The display device of claim 2, wherein
the length of each of the two first edges is at least 1.5 times the length of each of the two second edges.

4. The display device of claim 1, wherein one of the two second edges is covered by the second insulating layer.

5. The display device of claim 4, wherein
the second sub-contact hole includes:
two third edges parallel to the two first edges; and
two fourth edges parallel to the two second edges, and
a length of each of the two fourth edges is greater than the length of each of the two second edges.

6. The display device of claim 1, wherein both of the two second edges are covered by the second insulating layer.

7. The display device of claim 6, wherein
the second sub-contact hole includes:
two third edges parallel to the two first edges; and
two fourth edges parallel to the two second edges, and
a length of each of the two fourth edges is greater than the length of each of the two second edges.

8. The display device of claim 1, wherein
the second sub-contact hole includes:
two third edges parallel to the two first edges; and
two fourth edges parallel to the two second edges, and
a length of each of the two fourth edges is greater than the length of each of the two second edges.

9. The display device of claim 1, wherein the second sub-contact hole overlaps at least part of the first sub-contact hole in a plan view.

10. The display device of claim 9, wherein the first sub-contact hole is in a form of a rectangle.

11. A display device comprising:
a first wiring layer on a substrate;
a first insulating layer on the first wiring layer and including an inorganic material;
a second insulating layer on the first insulating layer and including an organic material; and
a second wiring layer on the second insulating layer and electrically connected to the first wiring layer through a contact hole of the first insulating layer and the second insulating layer, wherein
a thickness of the second insulating layer is greater than a thickness of the first insulating layer,
the contact hole includes:
a first sub-contact hole in the first insulating layer; and
a second sub-contact hole in the second insulating layer,
the first sub-contact hole includes:
two first edges parallel to each other; and
two second edges parallel to each other,
a length of each of the two first edges is greater than a length of each of the two second edges, and
a taper angle between each of the two first edges and a surface of the substrate is less than a taper angle between each of the two second edges and the surface of the substrate.

12. The display device of claim 11, wherein the length of each of the two first edges is at least 1.5 times the length of each of the two second edges.

13. The display device of claim 12, wherein
the second sub-contact hole includes:
two third edges parallel to the two first edges; and
two fourth edges parallel to the two second edges, and
a length of each of the two fourth edges is greater than the length of each of the two second edges.

14. The display device of claim 13, wherein at least part of the two fourth edges is disposed within the first sub-contact hole.

15. The display device of claim 14, wherein at least part of the two first edges and the two second edges of the first sub-contact hole is covered by the second insulating layer.

16. The display device of claim 11, wherein at least part of the two first edges and the two second edges of the first sub-contact hole is covered by the second insulating layer.

17. The display device of claim 11, wherein at least part of an edge of the second sub-contact hole is within the first sub-contact hole.

18. The display device of claim 11, wherein the second sub-contact hole overlaps at least part of at least one of the two second edges in a plan view.

* * * * *